(12) United States Patent
Yamazaki

(10) Patent No.: US 9,177,761 B2
(45) Date of Patent: *Nov. 3, 2015

(54) PLASMA CVD APPARATUS, METHOD FOR FORMING MICROCRYSTALLINE SEMICONDUCTOR FILM AND METHOD FOR MANUFACTURING SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1115 days.

This patent is subject to a terminal disclaimer.

(21) Appl. No.: 12/860,118

(22) Filed: Aug. 20, 2010

(65) Prior Publication Data

US 2011/0053357 A1 Mar. 3, 2011

(30) Foreign Application Priority Data

Aug. 25, 2009 (JP) ................................. 2009-194870

(51) Int. Cl.
*C30B 21/02* (2006.01)
*H01J 37/32* (2006.01)
*C23C 16/455* (2006.01)
*C23C 16/509* (2006.01)
(Continued)

(52) U.S. Cl.
CPC ..... *H01J 37/32449* (2013.01); *C23C 16/45565* (2013.01); *C23C 16/5096* (2013.01); *H01J 37/3244* (2013.01); *H01J 37/32541* (2013.01); *H01J 37/32834* (2013.01); *H01L 29/04* (2013.01); *H01L 29/66765* (2013.01); *H01L 29/78696* (2013.01); *H01L 21/0262* (2013.01); *H01L 21/02532* (2013.01); *H01L 21/02595* (2013.01)

(58) Field of Classification Search
USPC ....................................... 117/86, 89, 100, 101
See application file for complete search history.

(56) References Cited

U.S. PATENT DOCUMENTS 4,409,134 A 10/1983 Yamazaki
4,854,263 A 8/1989 Chang et al.
(Continued)

FOREIGN PATENT DOCUMENTS

EP 0303508 A 2/1989
EP 1 595 974 A2 11/2005
(Continued)

OTHER PUBLICATIONS

Niikura et al., "High-rate growth of microcrystalline silicon films using a high-density SiH4/H2 glow-discharge plasma", Thin Solid Films, Jun. 1, 2004, vol. 457, No. 1, pp. 84-89.

*Primary Examiner* — Robert M Kunemund
(74) *Attorney, Agent, or Firm* — Nixon Peabody LLP; Jeffrey L. Costellia

(57) ABSTRACT

A structure of a plasma CVD apparatus for forming a dense semiconductor film is provided. Further, a technique for forming a dense crystalline semiconductor film (e.g., a microcrystalline semiconductor film) without a cavity between crystal grains is provided. An electrode supplied with electric power for generating plasma is included in a reaction chamber of the plasma CVD apparatus. This electrode has a common plane on a surface opposite to a substrate, and the common plane is provided with depressed openings. Gas supply ports are provided on the bottom of the depressed openings or on the common plane of the electrode. The depressed openings are provided in isolation from one another.

20 Claims, 19 Drawing Sheets

(51) Int. Cl.
   *H01L 29/04* (2006.01)
   *H01L 29/66* (2006.01)
   *H01L 29/786* (2006.01)
   *H01L 21/02* (2006.01)

(56) References Cited

U.S. PATENT DOCUMENTS

| | | | |
|---|---|---|---|
| 5,314,724 | A | 5/1994 | Tsukune et al. |
| 5,773,100 | A | 6/1998 | Chang et al. |
| 6,040,022 | A | 3/2000 | Chang et al. |
| 6,162,667 | A | 12/2000 | Funai et al. |
| 6,451,665 | B1 | 9/2002 | Yunogami et al. |
| 7,090,705 | B2 | 8/2006 | Miyazaki et al. |
| 7,125,758 | B2 | 10/2006 | Choi et al. |
| 7,754,294 | B2 | 7/2010 | Choi et al. |
| 8,111,362 | B2 | 2/2012 | Yamazaki et al. |
| 8,158,531 | B2 | 4/2012 | Kitahara |
| 8,252,669 | B2 * | 8/2012 | Toriumi et al. ............... 438/488 |
| 8,258,025 | B2 * | 9/2012 | Yamazaki et al. ............ 438/158 |
| 8,476,638 | B2 * | 7/2013 | Toriumi et al. ................. 257/72 |
| 2004/0058492 | A1 | 3/2004 | Tatsumi |
| 2005/0022864 | A1 | 2/2005 | Fujioka et al. |
| 2005/0103377 | A1 | 5/2005 | Saneyuki et al. |
| 2005/0126487 | A1 | 6/2005 | Tabuchi et al. |
| 2005/0233092 | A1 | 10/2005 | Choi et al. |
| 2005/0251990 | A1 | 11/2005 | Choi et al. |
| 2005/0255257 | A1 | 11/2005 | Choi et al. |
| 2006/0005771 | A1 | 1/2006 | White et al. |
| 2006/0228496 | A1 | 10/2006 | Choi et al. |
| 2006/0236934 | A1 | 10/2006 | Choi et al. |
| 2006/0238132 | A1 | 10/2006 | Kitamura et al. |
| 2007/0063183 | A1 | 3/2007 | Kato et al. |
| 2007/0227666 | A1 | 10/2007 | Matsumoto et al. |
| 2008/0020146 | A1 | 1/2008 | Choi et al. |
| 2008/0308807 | A1 | 12/2008 | Yamazaki et al. |
| 2009/0002591 | A1 | 1/2009 | Yamazaki et al. |
| 2009/0047774 | A1 | 2/2009 | Yamazaki |
| 2009/0047775 | A1 | 2/2009 | Yamazaki et al. |
| 2009/0072237 | A1 | 3/2009 | Yamazaki et al. |
| 2009/0223557 | A1 | 9/2009 | Park et al. |
| 2010/0009516 | A1 | 1/2010 | Yao et al. |
| 2010/0307573 | A1 | 12/2010 | Matsumoto et al. |
| 2010/0323501 | A1 | 12/2010 | Yamazaki et al. |
| 2011/0053311 | A1 | 3/2011 | Hiura et al. |
| 2011/0053358 | A1 | 3/2011 | Toriumi et al. |
| 2012/0304932 | A1 | 12/2012 | Toriumi et al. |
| 2013/0012006 | A1 | 1/2013 | Yamazaki et al. |

FOREIGN PATENT DOCUMENTS

| | | |
|---|---|---|
| JP | 60-037118 | 2/1985 |
| JP | 62-062073 | 12/1987 |
| JP | 01-139771 A | 6/1989 |
| JP | 02-053941 | 11/1990 |
| JP | 04-037118 | 2/1992 |
| JP | 04-242724 | 8/1992 |
| JP | 05-068097 | 9/1993 |
| JP | 07-066132 | 3/1995 |
| JP | 07-193017 | 7/1995 |
| JP | 2816943 | 10/1998 |
| JP | 11-121761 | 4/1999 |
| JP | 2000-150472 A | 5/2000 |
| JP | 2000-252218 | 9/2000 |
| JP | 2000-277439 | 10/2000 |
| JP | 2002-237459 | 8/2002 |
| JP | 2002-237460 | 8/2002 |
| JP | 2002-237461 | 8/2002 |
| JP | 2002-280377 A | 9/2002 |
| JP | 2003-318000 | 11/2003 |
| JP | 2004-014958 | 1/2004 |
| JP | 2004-158839 A | 6/2004 |
| JP | 2004-200345 | 7/2004 |
| JP | 2004-296526 | 10/2004 |
| JP | 2005-049832 | 2/2005 |
| JP | 2005-167051 | 6/2005 |
| JP | 2005-259853 | 9/2005 |
| JP | 2005-328021 | 11/2005 |
| JP | 2006-032720 | 2/2006 |
| JP | 3837539 | 10/2006 |
| JP | 2007-005705 | 1/2007 |
| JP | 2007-048982 | 2/2007 |
| JP | 2007-129009 | 5/2007 |
| JP | 2009-076753 | 4/2009 |
| JP | 2009-302572 | 12/2009 |

* cited by examiner 141  143  144

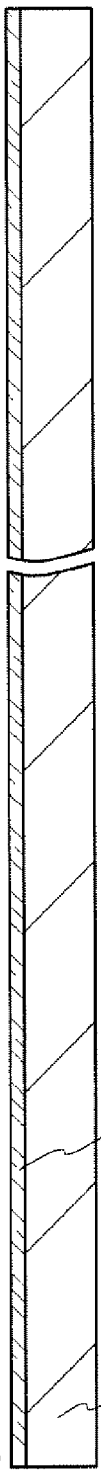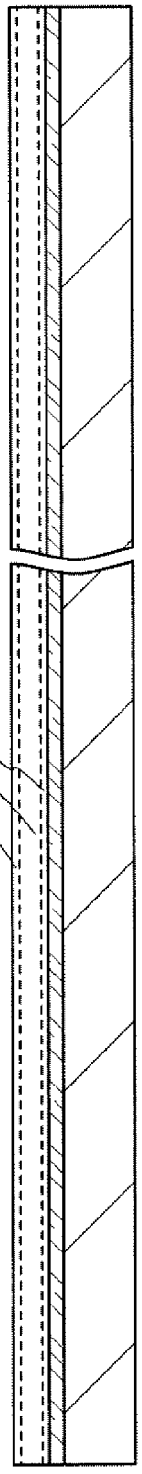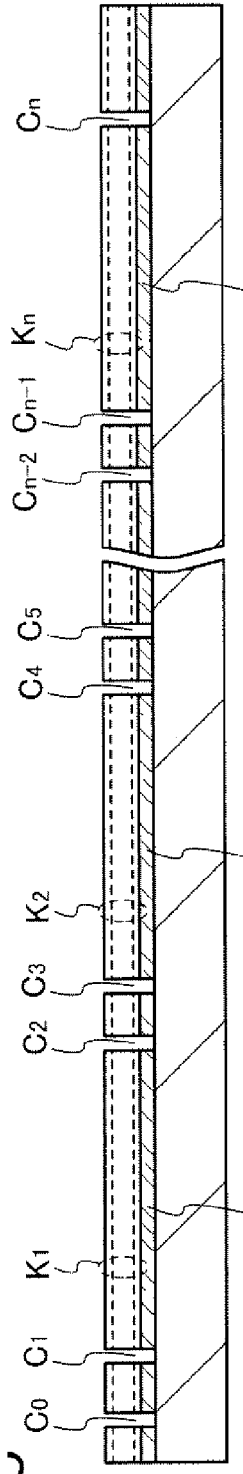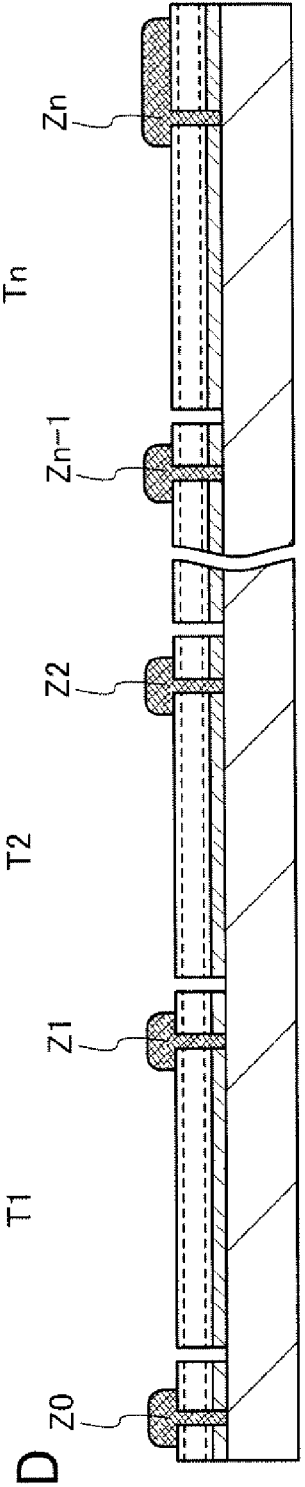

PLASMA CVD APPARATUS, METHOD FOR FORMING MICROCRYSTALLINE SEMICONDUCTOR FILM AND METHOD FOR MANUFACTURING SEMICONDUCTOR DEVICE

BACKGROUND OF THE INVENTION

1. Field of the Invention

An embodiment of the present invention relates to a plasma CVD apparatus for forming a semiconductor film. Further, an embodiment of the present invention relates to a method for forming a crystalline semiconductor film using a vapor deposition method and a method for manufacturing a semiconductor device including the crystalline semiconductor film.

2. Description of the Related Art

In a technical field of thin film transistors, a plasma chemical vapor deposition (plasma CVD) method which is used for formation of a semiconductor film is employed, and various improvements have been attempted to manufacture products with higher yields.

For example, an electrode structure of a plasma CVD apparatus is disclosed where an electrode for generating plasma in a reaction chamber is provided with cylindrical recessed portions and the cylindrical recessed portions are connected to each other through a groove which is narrower than the diameter of the cylindrical recessed portion (see Patent Document 1).

In addition, disclosed is a gas diffuser plate (a so-called shower plate) having a gas flow path, the diameter, depth, and surface area of which gradually increase toward an edge portion from a center portion, for dispersing gas in a treatment chamber and forming films uniform in thickness and characteristics (see Patent Document 2). As another example, disclosed is a technique for forming a film under the following conditions for forming higher quality films more efficiently: a ladder-like electrode is used; an ultra high-frequency power of 100 MHz is supplied with a gas pressure of 400 Pa; and a film formation rate is set to 2 nm/second with a distance of 6 mm between the ladder-like electrode and a substrate (see Patent Document 3).

REFERENCES

[Patent Document 1] Japanese Published Patent Application No. 2004-296526
[Patent Document 2] Japanese Published Patent Application No. 2005-328021
[Patent Document 3] Japanese Published Patent Application No. 2005-259853

SUMMARY OF THE INVENTION

However, a conventional plasma CVD apparatus has a structural defect in which an electric field is locally concentrated and therefore has not been able to form a dense microcrystalline semiconductor film. That is, a recessed portion or a projected portion is provided on a surface of a flat-plate electrode, whereby an electric field has been concentrated at a corner of the recessed portion or the projected portion. Therefore, a reactive gas reacts intensely in a region where an electric field is concentrated, and particles which are abnormally grown through reaction in a gas phase are included in a deposited film. Accordingly, a dense semiconductor film has not been able to be formed.

In view of the circumstances described above, an object of an embodiment of the invention disclosed in this specification is to provide the structure of a plasma CVD apparatus for forming a dense semiconductor film. In addition, another object of an embodiment of the invention disclosed in this specification is to provide a technique for forming a dense crystalline semiconductor film (e.g., a microcrystalline semiconductor film) without a cavity between crystal grains.

An embodiment of the present invention is a plasma CVD apparatus including an electrode supplied with electric power for generating plasma in a reaction chamber of the plasma CVD apparatus. This electrode has a common plane on a surface opposite to a substrate, and the common plane is provided with depressed openings. Gas supply ports are provided on the bottom of the depressed openings or on the common plane of the electrode. The depressed openings are provided in isolation from one another.

The depressed openings provided on the electrode, have the effect of increasing plasma density in the vicinity of the depressed openings. It is preferable that the opening end of the depressed opening have a smooth curved shape without a sharp end face. In other words, the depressed opening which is provided for the electrode preferably has a shape such that generation of a high-electric field is prevented at the corner of the opening end of the depressed opening, while plasma density is increased in a portion where the gas supply port exists. For example, it is preferable that a structure body of the depressed opening has a tapered shape and be chamfered.

Further, the opening end of the depressed opening has a shape such that an electric field is relaxed even in the case where predetermined amount of electric power for generating plasma is applied in a reaction chamber. For example, the corner between the sidewall of the depressed opening and a surface of the electrode (common plane) has a smooth curved shape without a sharp end face. Furthermore, the depressed opening may have a trumpet shape (a folding-fan shape) such that the depth which is narrow when seen from the common plane widens toward the opening end. That is, the cross-sectional shape of the depressed opening may be the shape in which the curvature radius changes continuously.

The depressed opening in the electrode has an aperture and a depth such that plasma can enter. Needless to say, the optimal values for the aperture and the depth of the opening vary depending on film-formation conditions, that is, the pressure for generating glow discharge plasma, a mean free path of a gas, and electric power. However, in order to increase the electron density and decrease the electron temperature, the pressure is set to greater than or equal to 450 Pa and less than or equal to 13332 Pa, preferably, greater than or equal to 450 Pa and less than or equal to 2000 Pa, more preferably greater than or equal to 500 Pa and less than or equal to 1500 Pa. In that case, the aperture of the opening is roughly set at greater than or equal to 2 mm and less than or equal to 20 mm; the depth, appropriately greater than or equal to 2 mm and less than or equal to 20 mm, preferably, 4 mm to 12 mm; and the distance between electrodes, greater than or equal to 1 mm and less than or equal to 20 mm, preferably 4 mm to 16 mm.

A high-density plasma region is formed in the vicinity of the gas supply port of the electrode supplied with electric power for generating plasma, and the reactive gas is supplied to the region, whereby decomposition of the reactive gas is promoted, and reaction of a deposition precursor (also referred to as nanocrystal) in a gas phase is increased. In order to promote such an effect, the electrode may be provided with a heating unit for encouraging the decomposition of the reactive gas.

In addition, an embodiment of the present invention is a method in which a high-density plasma region is formed in the vicinity of a gas supply port, through which a reactive gas is supplied to a reaction chamber, and in which a crystal of a semiconductor is grown in a gas phase including the high-density plasma region and depositing the crystal as a film.

It is preferable to increase a reaction pressure and reduce a distance between electrodes in order to grow a crystal of a semiconductor in a gas phase. As the reaction pressure is higher, there is an increase in the probability of collision reaction between radicals generated by glow discharge and between the radical and a reaction gas molecule. By reducing the distance between electrodes, a crystalline deposition precursor is made to reach to a deposition surface of a substrate before being enlarged, and the crystalline deposition precursor becomes a crystal nucleus on the deposition surface. Accordingly, the crystal nucleus is grown, whereby a semiconductor film having a dense crystallinity (microcrystalline semiconductor film) can be formed. Then, the crystalline deposition precursor is generated in a gas phase, whereby a semiconductor film having favorable crystallinity can be formed from the early stage of deposition.

An embodiment of the present invention is a method in which a high-density plasma region is formed in the vicinity of the common plane so as to form a film over a substrate by introducing a reactive gas in a reaction chamber so that the pressure of the reactive chamber is set to greater than or equal to 450 Pa and less than or equal to 13332 Pa, preferably, greater than or equal to 450 Pa and less than or equal to 2000 Pa, and supplying high-frequency power of 60 MHz or less to an electrode having depressed openings opposite to the electrode where the substrate over which a film is to formed is mounted. A deposition precursor is generated in such a manner that the reactive gas is supplied through the gas supply ports which are provided on the common plane of the electrode or the depressed openings thereof so that the reactive gas flows into a high-density plasma region. The deposition precursor is formed on a surface of the substrate to be deposited, whereby a crystal nucleus of greater than or equal to 5 nm and less than or equal to 15 nm is formed and a crystal is grown from the crystal nucleus. In that case, it is preferable that the distance between a pair of electrodes be greater than or equal to 1 mm and less than or equal to 20 mm, preferably greater than or equal to 4 mm and less than or equal to 16 mm, and a structure body of the depressed opening have a tapered shape and be chamfered so that overconcentration of an electric field does not occur.

In addition, it is preferable to add a rare gas to the reactive gas. The rare gas introduced into the reaction chamber together with the reactive gas has the effect of reducing an electron temperature and increasing electron density. Accordingly, the amount of the generated radicals is increased, a film formation rate is improved, crystallinity of a microcrystalline semiconductor film is improved, and thus the microcrystalline semiconductor film is densified. In order to obtain such an effect, it is necessary to excite the rare gas so as to be placed in a metastable state and therefore it is necessary to apply an electric field sufficient for generating excited species of the rare gas or for ionization of the rare gas. For example, when argon is added as the rare gas in addition to a silane gas and a hydrogen gas which are reactive gases, a hydrogen radical increases in number and crystallinity of a microcrystalline semiconductor film can be improved.

In addition, a structure body is provided on a surface of a flat-plate electrode and the structure body has a shape with a curved surface at the corner, whereby a high-density plasma region can be formed without concentration of an electric field at the corner. The reactive gas supplied through the gas supply port is made to flow into the high-density plasma region, whereby a deposition precursor can be generated in a gas phase, and the reaction can be promoted.

Moreover, collision between deposition precursors which has become nanocrystals does not occur by reducing a distance between the electrodes; thus, an amorphous component is not easily generated.

By using the electrodes having the above structure, the number of amorphous components included in a deposited microcrystalline semiconductor film can be reduced; thus, a dense microcrystalline semiconductor film can be formed.

BRIEF DESCRIPTION OF THE DRAWINGS

In the accompanying drawings:

FIGS. 14A to 14D illustrate a method for manufacturing a photoelectric conversion device.

DETAILED DESCRIPTION OF THE INVENTION

Figure 1A:
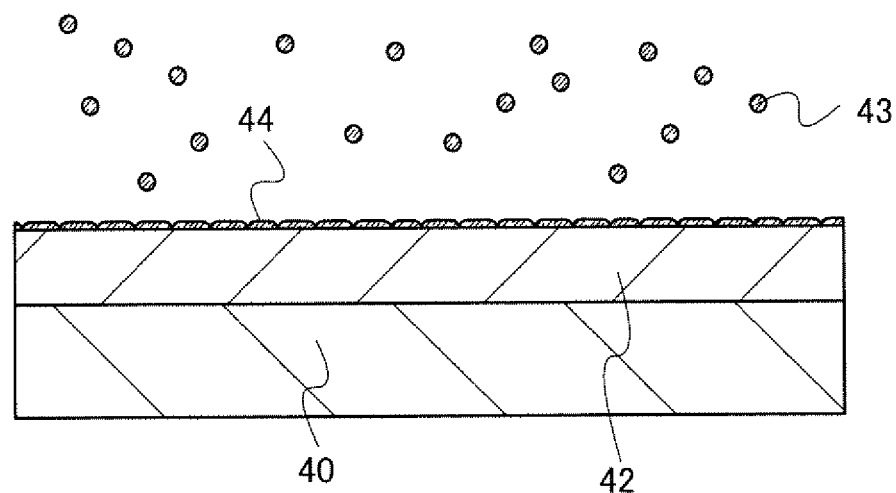
FIGS. 1A and 1B illustrate a method for forming a microcrystalline semiconductor film.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. Note that the size, the layer thickness, or the region of each structure illustrated in each drawing is exaggerated for clarity in some cases. Therefore, the present invention is not necessarily limited to such scales illustrated in the drawings.

Embodiment 1

In this embodiment, a method for forming a microcrystalline semiconductor film having high crystallinity is described with reference to FIGS. 1A and 1B, FIG. 2, FIGS. 3A and 3B, FIGS. 4A and 4B, FIGS. 5A and 5B, FIGS. 6A and 6B, FIG. 7, FIGS. 8A to 8D, FIGS. 17A and 17B, FIGS. 18A and 18B, and FIGS. 19A and 19B.

Figure 1B:
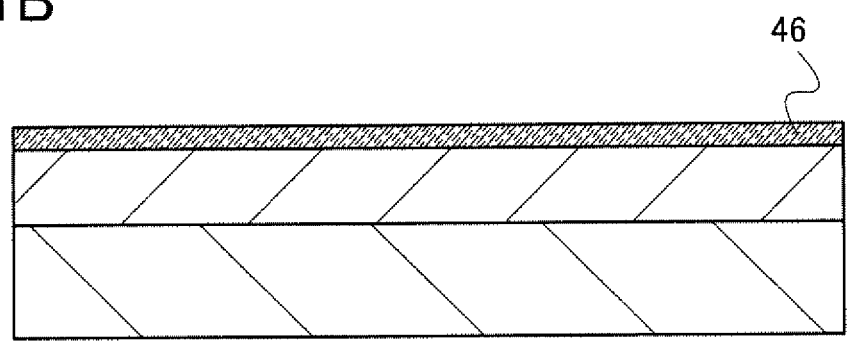

As illustrated in FIG. 1A, in a method for forming a microcrystalline semiconductor film shown in this embodiment, deposition precursors 43 are formed in a gas phase, the deposition precursors 43 are deposited over a base film 42 which is formed over a substrate 40, and crystal nuclei 44 are formed. Next, as illustrated in FIG. 1B, a microcrystalline semiconductor film is formed over the crystal nuclei 44, whereby crystals are grown using the crystal nuclei 44 as nuclei so that a microcrystalline semiconductor film 46 can be formed.

The deposition precursor 43 is formed through reaction of electrons and a source gas in plasma. The pressure in a film formation chamber can be higher than a film formation pressure 300 Pa for a conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. The deposition precursor, the size of which is several nanometers, is successively reacted with a plurality of radicals; therefore, it can also be said that the deposition precursor is a higher-order radical $(SiH_n)_x$ (n=1, 2, 3) which is somewhat well ordered. In the case where the source gas is a deposition gas containing silicon or germanium, the deposition precursor 43 is formed using silicon, germanium, or silicon germanium. Therefore, the deposition precursors 43 deposited over the base film 42 become the crystal nuclei 44. Alternatively, the deposition precursors 43 deposited over the base film 42, which are combined with an active radical which is released in plasma, become the crystal nuclei 44. The crystal nuclei 44, the size of which is 5 nm to 15 nm inclusive, are well ordered because, in a crystal grain, a crystallite which is a fine crystal that can be considered as a single crystal is included. Accordingly, when the active radicals which are released in plasma reach to the crystal nuclei 44, crystals are grown using the crystal nuclei 44 as nuclei; therefore, the microcrystalline semiconductor film 46 having high crystallinity can be formed from the interface between the base film and the crystal nuclei.

In this embodiment, the crystal nuclei 44 can be deposited densely over the base film 42 in such a manner that the pressure of a film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. That is, the adjacent crystal nuclei 44 which are in close contact can be deposited over the base film 42. Accordingly, when crystals are grown using the crystal nuclei 44 as nuclei, crystal grains become dense, and an amorphous semiconductor and a low-concentration region between the crystal grains are reduced; therefore, the microcrystalline semiconductor film 46 having high crystallinity can be formed.

Note that the base film 42 is a film having a surface over which the microcrystalline semiconductor film 46 is formed. The substrate 40 and the base film 42 can be used as appropriate.

Here, a plasma CVD apparatus capable of forming the deposition precursors 43 and the crystal nuclei 44 which are characteristics of this embodiment is described with reference to FIG. 2, FIGS. 3A and 3B, FIGS. 4A and 4B, FIGS. 5A and 5B, FIGS. 6A and 6B, FIG. 7, and FIGS. 8A to 8D.

Figure 2:
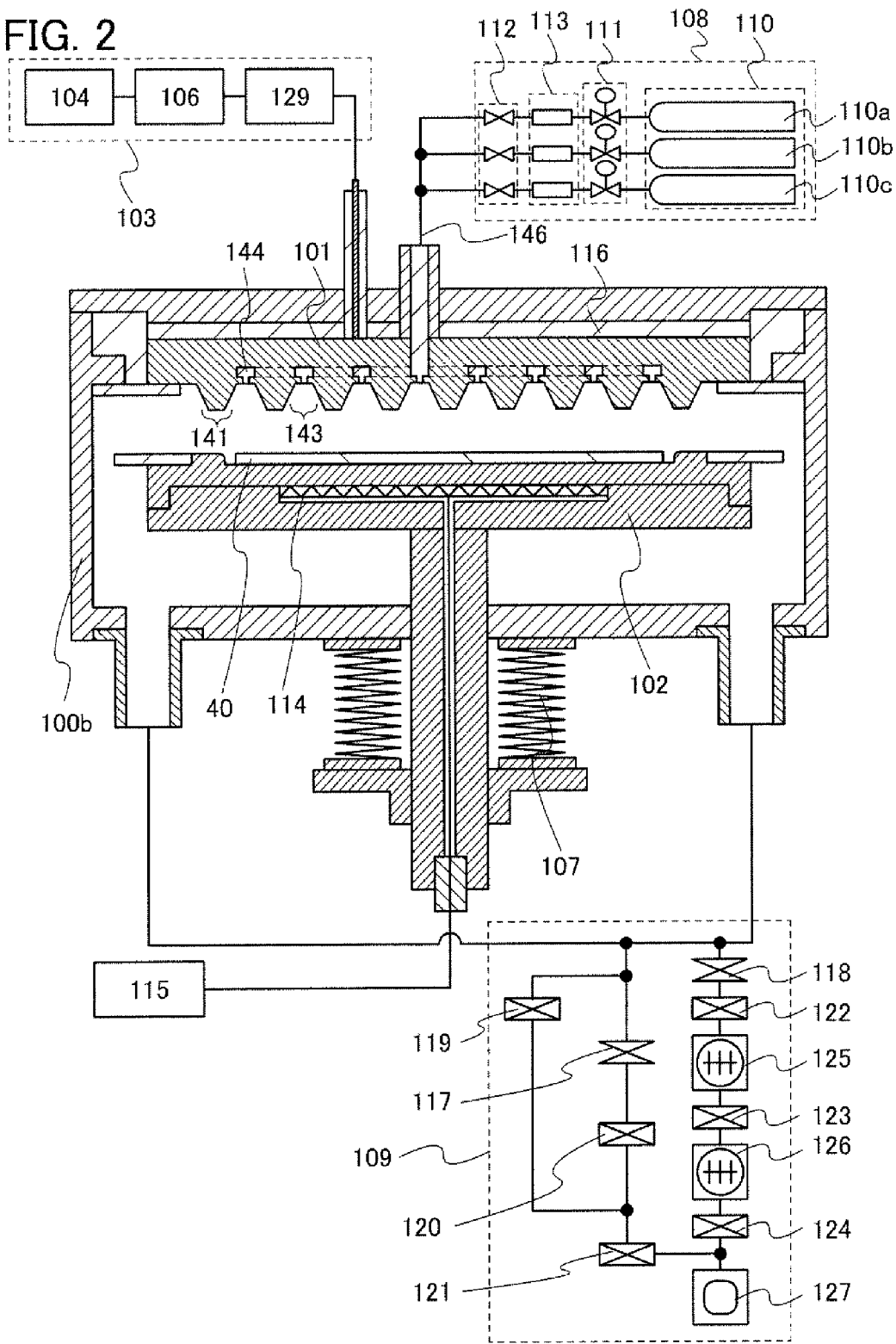
FIG. 2 illustrates an example of a plasma CVD apparatus.

FIG. 2 illustrates a structure of a plasma CVD apparatus. A reaction chamber 100b is formed using a stiff material such as aluminum or stainless steel and has a structure in which the inside of the reaction chamber 100b can be vacuum-evacuated. The reaction chamber 100b in this embodiment is formed using stainless steel in order to increase its mechanical strength, and the inside thereof is coated with aluminum by thermal spraying. In addition, it is preferable that the reaction chamber of the plasma CVD apparatus in this embodiment can be disassembled for maintenance and that the inside of the reaction chamber 100b be regularly recoated with aluminum by thermal spraying. The reaction chamber 100b is provided with a first electrode 101 (also referred to as an upper electrode) and a second electrode 102 (also referred to as a lower electrode) which is opposite to the first electrode 101.

A high-frequency power supply unit 103 is connected to the first electrode 101. The second electrode 102 is grounded, and the substrate 40 can be placed on the second electrode 102. The first electrode 101 is insulated from the reaction chamber 100b by an insulating material 116 so that high-frequency power does not leak. In the case where, for example, a ceramic material is used for the insulating material 116, it is difficult to use a knife-edge-type metal-seal flange for sealing of the upper electrode and thus, an O-ring seal is preferably used.

Although the first electrode 101 and the second electrode 102 have a capacitively coupled (parallel plate) structure in FIG. 2, an embodiment of the present invention is not limited thereto. Another structure such as an inductively coupled structure or the like may be employed as long as the structure can generate glow discharge plasma in the reaction chamber 100b by supplying high-frequency power.

The first electrode 101 is an electrode that is projected and depressed by having projected portions 141 and depressed portions 143 arranged regularly, preferably at regular intervals. That is, the depressed portions 143 which are opening portions of depressions are arranged regularly, preferably at regular intervals on a common plane opposite to the second electrode. Further, gas supply ports of hollow portions 144 connected to a gas supply unit 108 are provided in the depressed portions 143 of the first electrode 101. Here, the region having the gas supply port near a surface of the second electrode 102 is regarded as the projected portion 141, and the region having the gas supply port distant from the surface of the second electrode 102 is regarded as the depressed portion 143.

The hollow portions 144 are connected to the cylinder 110a of the gas supply unit 108 via the gas line 146, which is filled with a deposition gas containing silicon or germanium.

The gas supply unit 108 includes a cylinder 110 filled with gases, a pressure adjusting valve 111, a stop valve 112, a mass flow controller 113, and the like. Further, the gas supply unit 108 includes the cylinder 110a filled with a deposition gas containing silicon or germanium, a cylinder 110b filled with hydrogen, and a cylinder 110c filled with a diluent gas. Note that the cylinder 110c filled with the diluent gas is provided here; however, it is not necessarily required.

As examples of the deposition gas containing silicon or germanium, which fills the cylinder 110a, a silane ($SiH_4$) gas, a disilane ($Si_2H_6$) gas, a germane ($GeH_4$) gas, a digermane ($Ge_2H_6$) gas, and the like are given; however, any other deposition gas may be used.

As the diluent gas, which fills the cylinder 110c, a rare gas such as argon, xenon, or krypton is given.

A substrate heater 114, a temperature of which is controlled by a heater controller 115, is provided in the second electrode 102. In the case where the substrate heater 114 is provided inside the second electrode 102, a thermal conduction heating method is employed. For example, the substrate heater 114 may include a sheathed heater.

The high-frequency power supply unit 103 includes a high-frequency power source 104, a matching box 106, and a high-frequency cut filter 129. High-frequency power supplied from the high-frequency power source 104 is supplied to the first electrode 101.

The high-frequency power source 104 supplies high-frequency power at a frequency of 60 MHz or less. In the case where a large substrate of the seventh or later generation is used as a substrate placed on the second electrode 102, the high-frequency power source 104 preferably supplies high-frequency power at a wavelength of approximately 10 m or more. Typically, high-frequency power at a frequency of 13.56 MHz or less, for example, from 3 MHz to 13.56 MHz inclusive, is preferably supplied. When the high-frequency power source 104 supplies high-frequency power at a frequency in the above range, even if a large substrate of the seventh or later generation is placed on the second electrode 102 and glow discharging is performed, plasma can be generated uniformly without the adverse effect of a surface standing wave; therefore, a film which is uniform and has good film quality can be formed over an entire surface even in the case of the large substrate.

In addition, when high-frequency power source with a frequency of 13.56 MHz is used for the high-frequency power source 104, a variable capacitor with a capacitance of 10 pF to 100 pF is used for the high-frequency cut filter 129.

By further using a coil for the high-frequency cut filter 129, a parallel resonance circuit using a coil and a variable capacitor may be formed.

An evacuation unit 109 connected to the reaction chamber 100b has a function of vacuum evacuation and a function of controlling the inside of the reaction chamber 100b to be kept at a predetermined pressure in the case where a reactive gas is supplied. The evacuation unit 109 includes butterfly valves 117 and 118, stop valves 119 to 124, turbo molecular pumps 125 and 126, a dry pump 127, and the like. The turbo molecular pump 126 is connected to the dry pump 127 through the stop valve 124.

In the case where the reaction chamber 100b is vacuum evacuated, first, the stop valve 119 and the stop valve 121 for rough vacuum are opened and the reaction chamber 100b is evacuated with the dry pump 127. Then, the stop valve 119 is closed and the butterfly valve 117 and the stop valve 120 are opened for vacuum evacuation. In the case where ultrahigh vacuum evacuation is performed to obtain a pressure lower than $10^{-5}$ Pa in the reaction chamber 100b, the reaction chamber 100b is evacuated with the dry pump, the butterfly valve 117 and the stop valves 120 and 121 are closed, the butterfly valve 118 and the stop valves 122 to 124 are opened, and then vacuum evacuation is performed using the turbo molecular pumps 125 and 126 and the dry pump 127 which are connected in series. In addition, after the vacuum evacuation is performed, the reaction chamber 100b is preferably subjected to heat treatment so that degassing of the inner wall is performed.

A distance (also referred to as a gap) between the first electrode 101 and the second electrode 102 can be adjusted as appropriate. The gap between the electrodes can be adjusted in such a manner that the height of the second electrode 102 is changed in the reaction chamber 100b. By using a bellows 107, the gap between the electrodes can be adjusted with the reaction chamber 100b maintained in a vacuum.

Figure 3A:
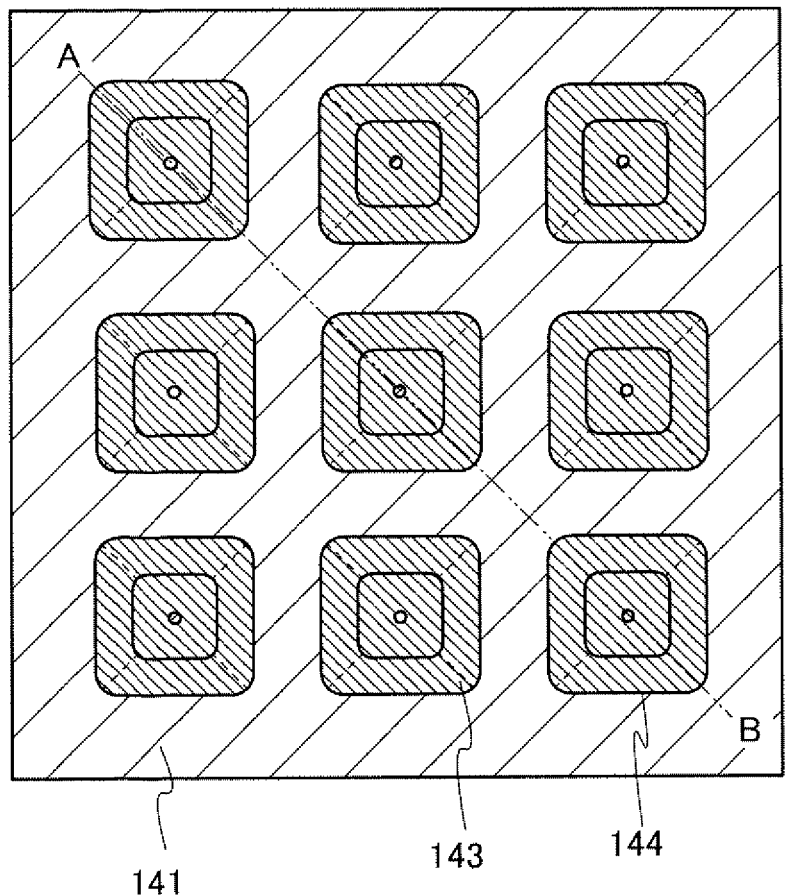
FIGS. 3A and 3B illustrate a shape of an upper electrode of the plasma CVD apparatus.
Figure 3B:
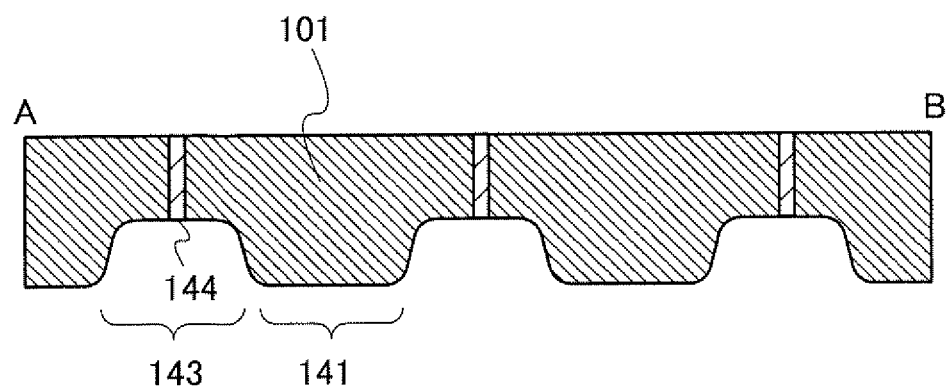
Figure 4A:
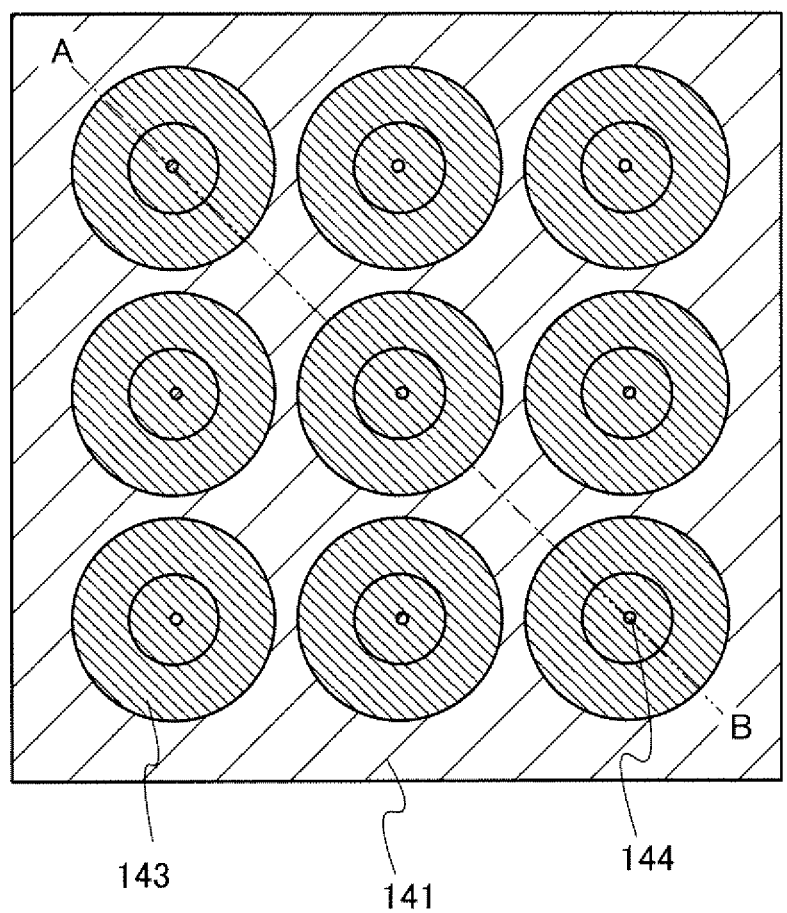
FIGS. 4A and 4B illustrate a shape of an upper electrode of the plasma CVD apparatus.
Figure 4B:
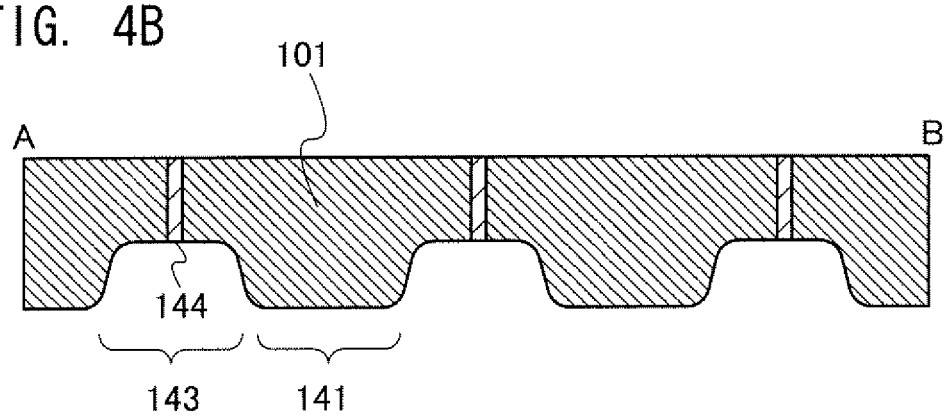

Here, examples of the shape of the first electrode 101 are described with reference to FIGS. 3A and 3B and FIGS. 4A and 4B. FIG. 3A and FIG. 4A are plan views of the first electrode 101 seen from the second electrode 102 side. FIGS. 3B and 4B are cross-sectional views taken along line A-B in FIG. 3A and FIG. 4A. Note that in FIG. 3A and FIG. 4A, regions which are projected to the second electrode 102 side (that is, projected portions) are shown by a wide hatch pattern, and regions which are depressed (that is, depressed portions) are shown by a narrow hatch pattern for clear illustration of the state of the projection and depression.

As illustrated in FIGS. 3A and 3B, the gas supply ports of the hollow portions 144 formed in the depressed portions 143 are provided regularly, preferably at regular intervals. The gas supply ports of the hollow portions 144 are provided in the depressed portions 143. The bottom of the plurality of depressed portions 143 are separated from one another, and the projected portions 141 form a continuous plane (common plane). Here, the depressed portions 143 each have the shape of a truncated quadrangular pyramid. Note that the shape of the depressed portions 143 is not limited thereto and may be a truncated triangular pyramid, a truncated pentagonal pyramid, a truncated hexagonal pyramid, or any other truncated polygonal pyramid as appropriate. Preferably, an edge and a corner of the depressed portion 143 are roundly chamfered to form a truncated polygonal pyramid with the corners rounded. When the edges and corners of the projected portion 141 and the depressed portion 143 are roundly chamfered, overconcentration of an electric field can be reduced. Accordingly, local arc discharge can be suppressed, leading to less generation of particles.

As illustrated in FIGS. 4A and 4B, the depressed portion 143 may alternatively have the shape of a truncated cone. Further, the gas supply ports of the hollow portions 144 are provided in the depressed portions 143. Note that it is preferable that the edge of the depressed portion 143 be roundly chamfered to form a truncated cone with the corners rounded. When the edges and corners of the projected portions 141 and the depressed portions 143 are roundly chamfered, overconcentration of an electric field can be reduced. Accordingly, local arc discharge can be suppressed, leading to less generation of particles.

Figure 5A:
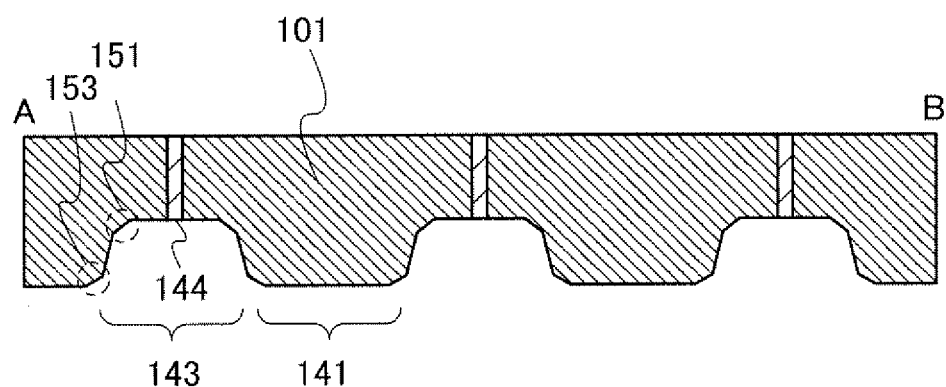
FIGS. 5A and 5B each illustrate a shape of an upper electrode of the plasma CVD apparatus.

Although the depressed portions 143 each have the shape of the polygonal pyramid or a truncated cone with the corners rounded in FIGS. 3A and 3B and FIGS. 4A and 4B, the edge and corner of the truncated polygonal pyramid or truncated cone can be chamfered without being rounded as illustrated in FIG. 5A. Typically, the depressed portion 143 can be tapered and a corner 151 can be chamfered. Further, the projected portion 141 can be tapered and a corner 153 can be chamfered. When each of the cross sections is tapered in the projected portion 141 and the depressed portion 143, concentration of an electric field at these portions can be reduced, leading to less generation of particles.

Figure 5B:
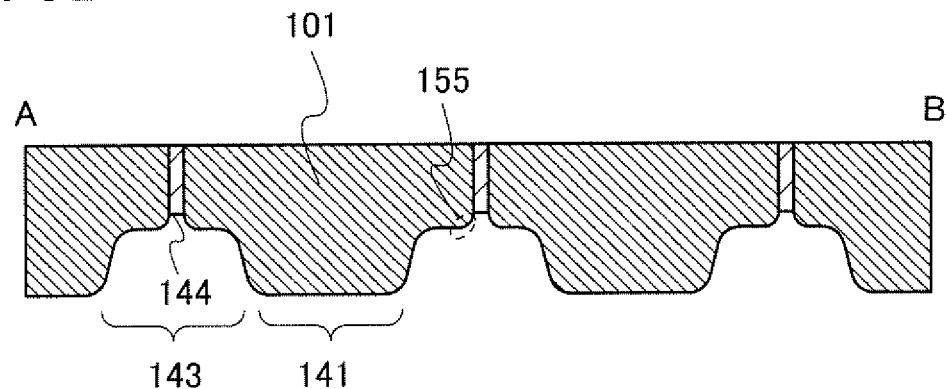

Further, in the depressed portion 143 illustrated in FIGS. 3A and 3B and FIGS. 4A and 4B, an edge 155 or a corner in the periphery of the gas supply port of the hollow portion 144 may be rounded as illustrated in FIG. 5B. The periphery of the gas supply port of the hollow portion 144 may be chamfered, although not illustrated. Accordingly, concentration of an electric field in the periphery of the gas supply port can be reduced, leading to less generation of particles.

Figure 6A:
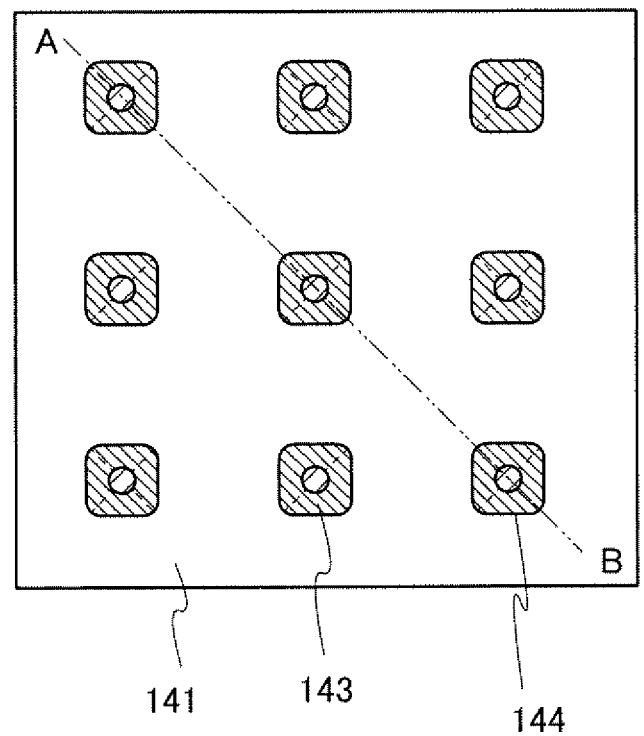
FIGS. 6A and 6B illustrate a shape of an upper electrode of the plasma CVD apparatus.
Figure 6B:
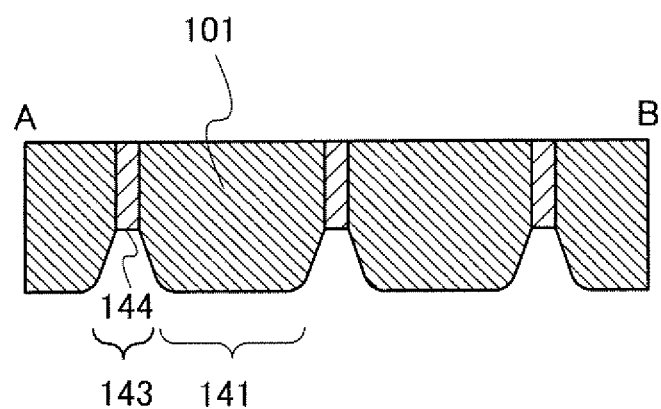

Further, as illustrated in FIGS. 6A and 6B, a flat portion is not necessarily formed in the depressed portion 143. Specifically, the depressed portion 143 may have a shape that is formed by a side surface of the projected portion 141 and the gas supply port of the hollow portion 144.

Figure 8A:
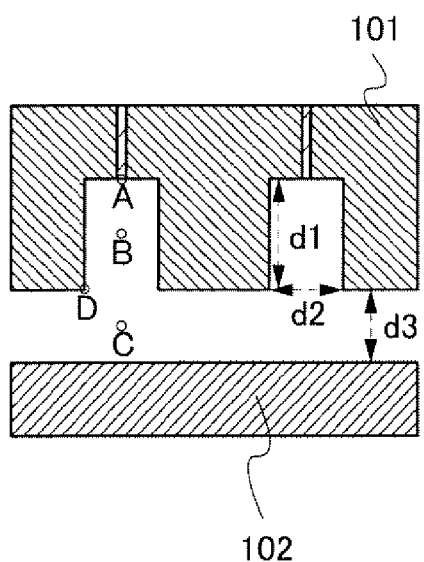
FIGS. 8A to 8D illustrate intensities of plasma in the plasma CVD apparatus.
Figure 8B:
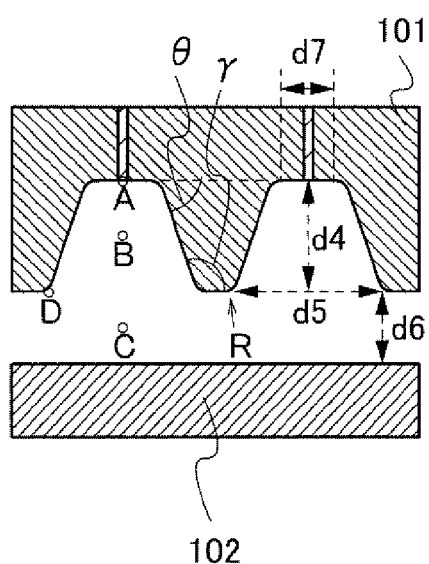
Figure 8C:
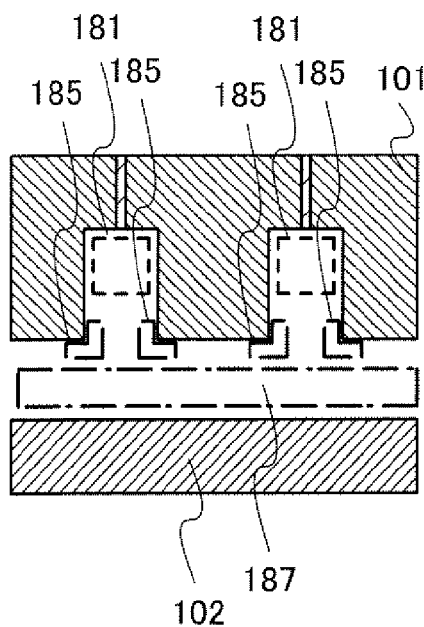
Figure 8D:
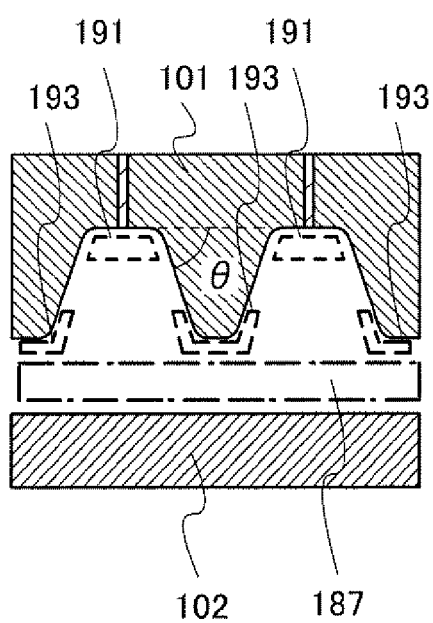

Here, a cross-sectional shape of the first electrode 101 and electric field intensity are described using FIGS. 8A to 8D. FIGS. 8A and 8B each show the cross-sectional shape of the first electrode 101 used for calculation. FIGS. 8C and 8D each show the electric field intensity calculated with an electric field simulator.

FIG. 8A illustrates the shape (first shape) in which a side surface of the projected portion of the first electrode 101 is perpendicular to a surface of the depressed portion. FIG. 8B illustrates the shape (second shape) in which the cross-sectional shape of the projected portion of the first electrode 101 is tapered: when the angle between the side surface of the projected portion of the first electrode 101 and the extended line of the surface of the depressed portion in the projected portion is θ and the angle between a surface of an apex and side surface of the projected portion is γ, θ is less than 90° and γ is more than 90°. In the case where the cross section of the projected portion is tapered (in the case of FIG. 8B), the cross-sectional area monotonically decreases toward the apex.

In FIG. 8A, the depth of the depressed portion, d1, is 40 mm, the distance between adjacent projected portions, d2, is 20 mm, and the distance between the first electrode 101 and the second electrode 102, d3, is 20 mm.

In FIG. 8B, the depth of the depressed portion, d4, is 40 mm, the distance between the apexes of adjacent projected portions on the second electrode 102 side, d5, is 60 mm, and the distance between the first electrode 101 and the second electrode 102, d6, is 20 mm. Note that the diameter of the plane on the depressed portion where the gas supply ports are formed, d7, is 20 mm. Further, the curvature radius of the edge and corner of the projected portion, R, is 10 mm.

Table 1 shows the results of calculation of the electric field intensities in the vicinity of the gas supply port, A, the vicinity of the center of the depressed portion, B, the vicinity of the second electrode 102 on the depressed portion side, C, and the close vicinity of the projected portion in the first electrode 101, D, which are illustrated in each of FIGS. 8A and 8B. In Table 1, the electric field intensity in the vicinity of the projected portion in the first electrode 101 illustrated in FIG. 8A, which is denoted by D, is set to 1, and the electric field intensities in the other regions are normalized. At this time, the frequency of power supplied to the first electrode 101 is 13.56 MHz.

TABLE 1

|  | A | B | C | D |
| --- | --- | --- | --- | --- |
| First Shape | 0.0006 | 0.01 | 0.6 | 1 |
| Second Shape | 0.01 | 0.1 | 0.6 | 0.9 |

FIG. 8C shows distribution of the electric field intensities calculated using the first electrode of FIG. 8A. FIG. 8D shows distribution of the electric field intensities calculated using the first electrode of FIG. 8B.

In FIG. 8C, regions 181 having an extremely low electric field are formed in the vicinity of the surfaces of the depressed portion between the adjacent projected portions (the vicinity of A), while regions 185 having a high electric field are formed between the projected portion and plasma 187 (the vicinity of the projected portion of the first electrode 101 (the vicinity of D)).

In contrast, regions 191 having a moderated electric field are formed in the depressed portions and regions 193 having a moderate electric field are formed in the vicinity of the side surfaces of the apexes of the adjacent projected portions in FIG. 8D, because the more electromagnetic waves pass through up to the surface of the depressed portion as the taper angle θ decreases.

Comparison between FIGS. 8C and 8D indicates that the shape of the first electrode illustrated in FIG. 8B allows a decrease in the electric field at the apex of the projected portion, especially at the edge and corner of the projected portion, thereby reducing plasma damage to the surface of the substrate and reducing generation of particles which is caused by arc discharge.

Next, cross-sectional shapes of the first electrode 101, a plasma potential, distribution of silane density, and a generation rate of silane are described with reference to FIGS. 17A and 17B, 18A and 18B, and 19A and 19B. Here, the calculation was performed using multi-physics analysis software, (CFD-ACE+) developed by CFD Research Corporation.

Figure 17A:
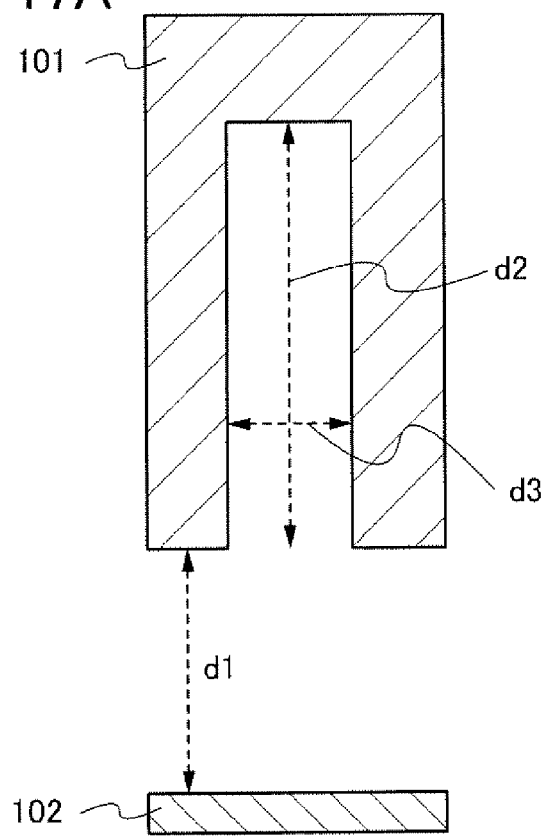
FIGS. 17A and 17B each illustrate a shape of an upper electrode of a plasma CVD apparatus.
Figure 17B:
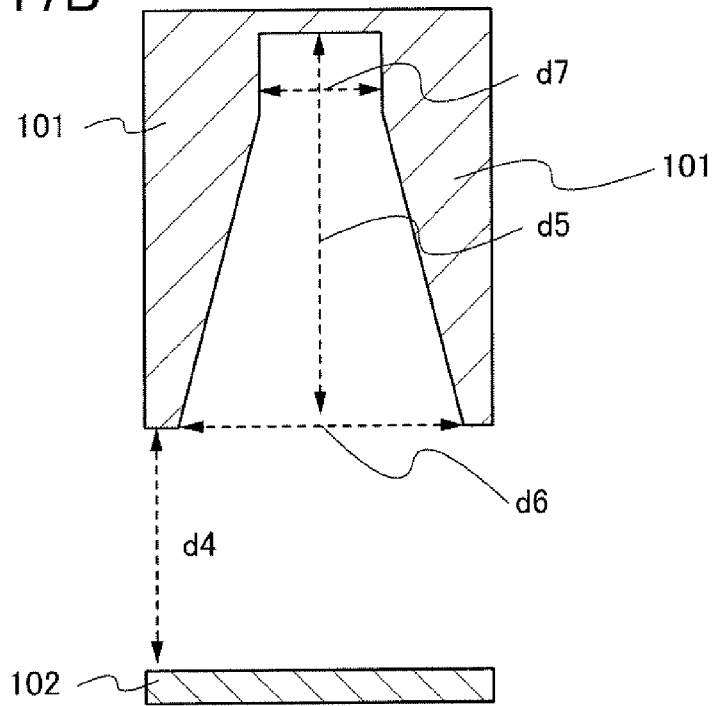

FIGS. 17A and 17B illustrate models that were used for the calculation. In FIG. 17A, a depressed portion of the first electrode 101 is a column shape, and in FIG. 17B, the depressed portion of the first electrode 101 is a truncated conical shape.

In FIG. 17A, the distance between the first electrode 101 and the second electrode 102, d1, is set to be 8 mm, the depth of the depressed portion (that is the height of the column), d2, is set to be 15 mm, and the distance between the adjacent projected portions, d3, is set to be 4 mm.

In FIG. 17B, the distance between the first electrode 101 and the second electrode 102, d4, is set to be 8 mm, the depth of the depressed portion (that is the height of the truncated cone), d5, is set to be 15 mm, and the distance between the apexes of the adjacent projected portions in the second electrode 102 (that is a base diameter of the truncated cone), d6, is set to be 11.6 mm. Note that the width of a plane surface where a gas supply port is formed in the depressed portion (that is, a top diameter of the truncated cone), d7, is set to be 4 mm.

Figure 18A:
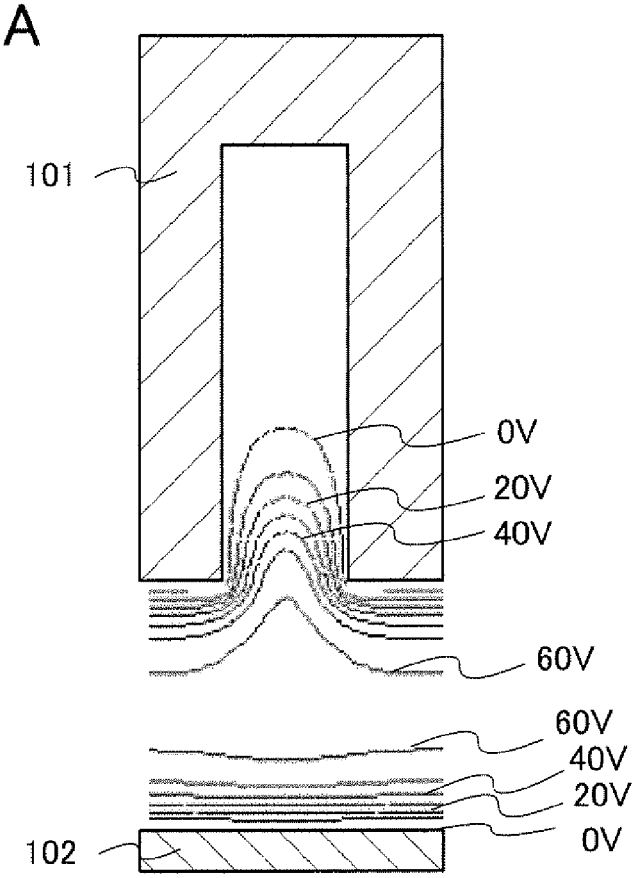
FIGS. 18A and 18B each show time average potential distribution in accordance with the shape of the upper electrode of the plasma CVD apparatus.
Figure 18B:
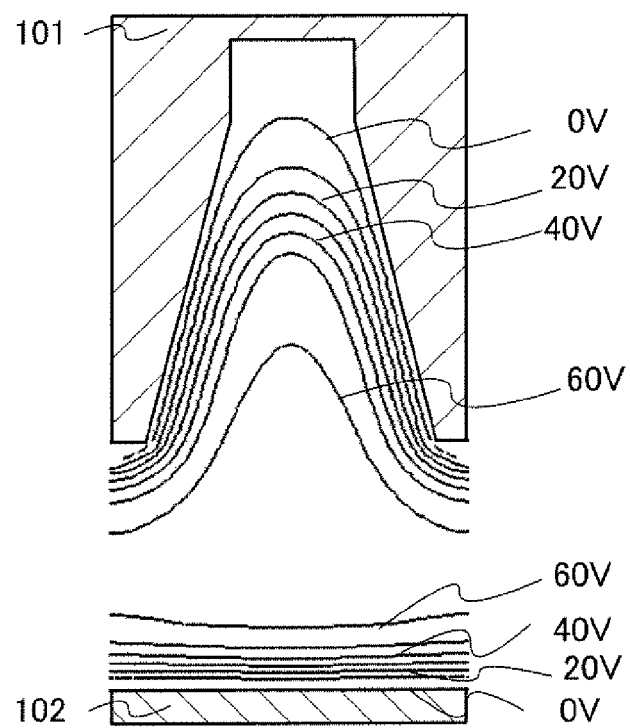

FIGS. 18A and 18B show time average potential distribution obtained by the calculation on the assumption that hydrogen and silane are introduced at flow rates of 15 sccm and 0.1 sccm, respectively, into a reaction chamber of the plasma CVD apparatus including the first electrode 101 and the second electrode 102 in FIGS. 17A and 17B, the pressure is set to 1000 Pa, the temperature of the hydrogen and the silane are set to 250° C., and high-frequency power at a frequency of 13.56 MHz (voltage amplitude is 200V) is supplied. Further, FIGS. 19A and 19B show distribution of silane density obtained by the same calculation.

FIGS. 18A and 18B respectively show the time average potential distribution in FIGS. 17A and 17B using contour lines. It is apparent that higher potential is distributed in the entire depressed portions of the first electrode in FIG. 18B as compared to FIG. 18A.

Figure 19A:
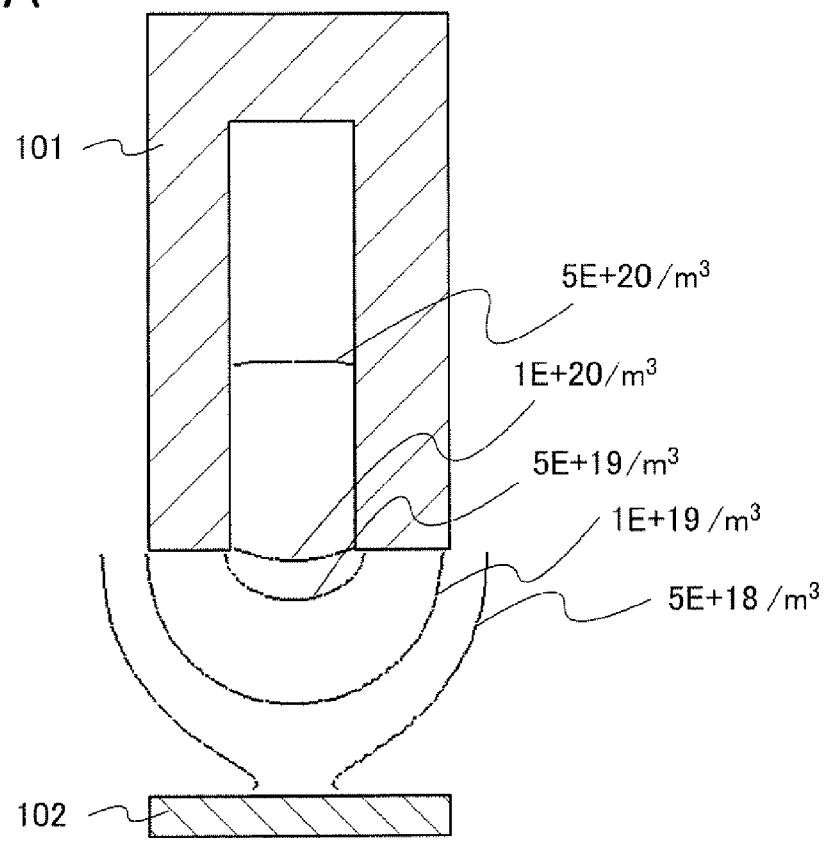
FIGS. 19A and 19B each show distribution of silane density in accordance with the shape of the upper electrode of the plasma CVD apparatus.
Figure 19B:
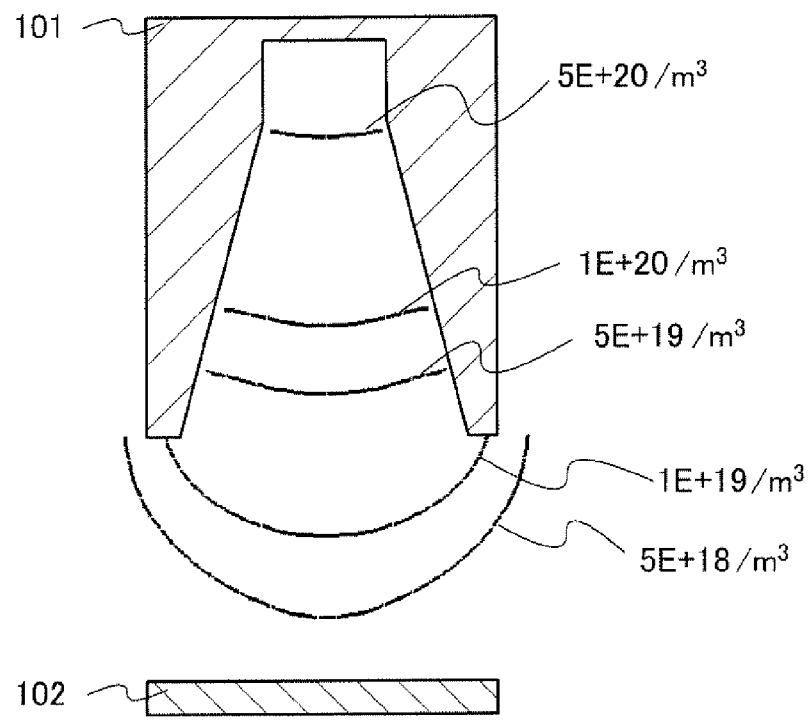

FIGS. 19A and 19B respectively illustrate the distribution of silane density in FIGS. 17A and 17B using contour lines. It is apparent that the distribution of silane density is decreased in the entire depressed portions of the first electrode in FIG. 19B as compared to FIG. 19A.

According to FIGS. 19A and 19B, it is observed that decomposition of silane is advanced, and $SiH_3$ that is an active radical is increased by forming the depressed portion to have the shape of a truncated cone. As a result, the active radicals are reacted with one another, and the deposition precursor 43 is easily formed as illustrated in FIG. 1A.

Figure 7:
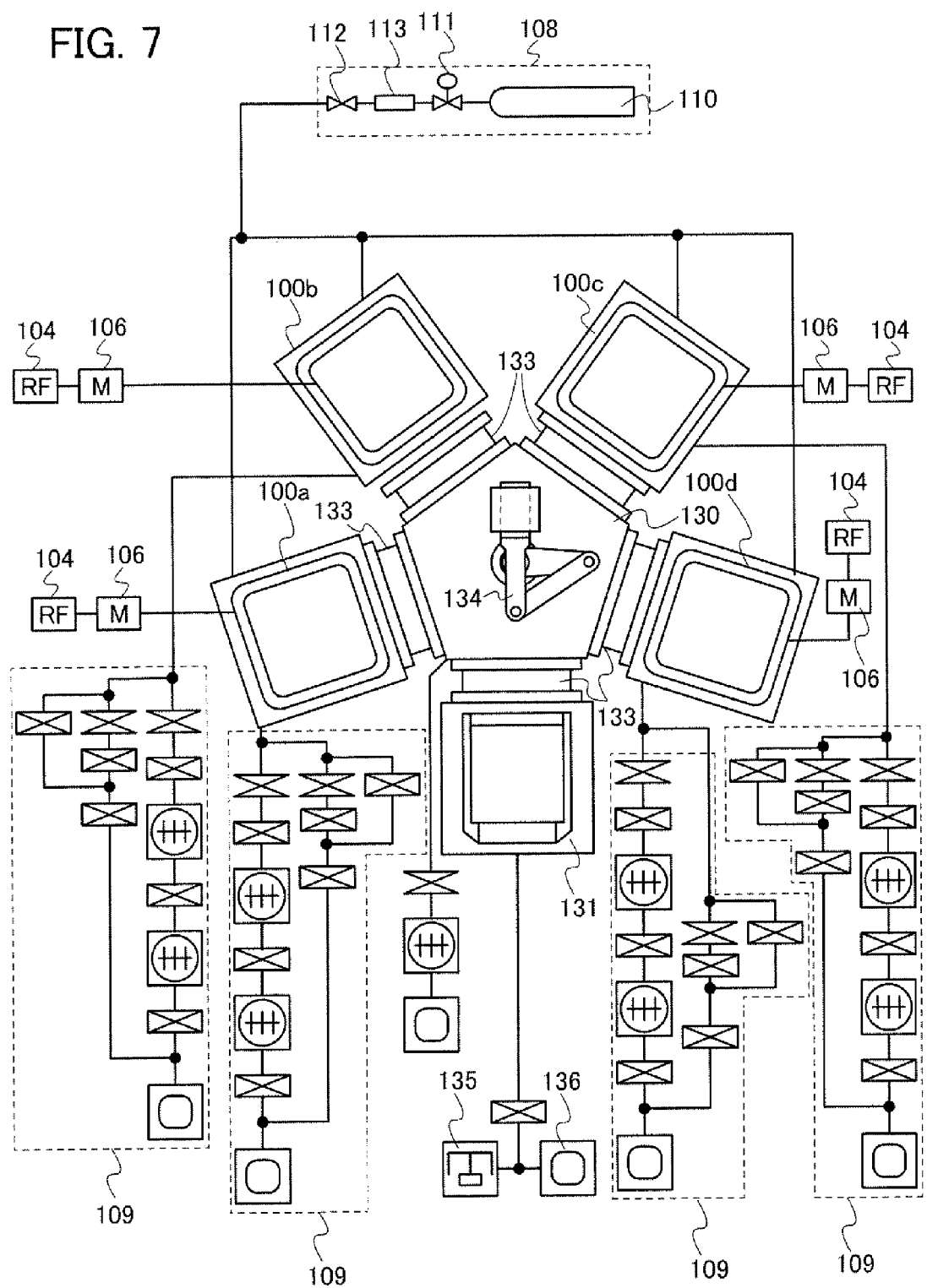
FIG. 7 illustrates an example of a film formation apparatus.

FIG. 7 is a schematic diagram illustrating one mode of a multi-chamber plasma CVD apparatus provided with a plurality of reaction chambers. This apparatus is provided with a common chamber 130, a load/unload chamber 131, a first reaction chamber 100a, a second reaction chamber 100b, a third reaction chamber 100c, and a fourth reaction chamber 100d. This multi-chamber plasma CVD apparatus is a single-wafer processing type in which a substrate set in a cassette in the load/unload chamber 131 is carried in and out of each reaction chamber by a transport mechanism 134 of the common chamber 130. A gate valve 133 is provided between the common chamber 130 and each reaction chamber so that treatments conducted in the reaction chambers do not interfere with each other.

The reaction chambers are separately used for forming different kinds of thin films. Needless to say, the number of the reaction chambers is not limited to four and may be increased or decreased as needed. One film may be formed in one reaction chamber, or a plurality of films may be formed in one reaction chamber.

The evacuation unit 109 is connected to each reaction chamber. The evacuation unit is not limited to a combination of the vacuum pumps illustrated in FIGS. 2 and 7 and another vacuum pump can be used as long as evacuation can be performed to a degree of vacuum within the range of approximately $10^{-5}$ Pa to $10^{-1}$ Pa.

In addition to a drypump 136, a cryopump 135 that can perform ultra-high vacuum evacuation may be connected to the load/unload chamber 131. By using the cryopump 135, the load/unload chamber 131 can be evacuated to an ultra-high vacuum of a pressure of lower than $10^{-5}$ Pa, and the concentration of an impurity contained in a film deposited on a substrate in the reaction chamber can be reduced. Further, the pumping speed of the cryopump 135 is higher than that of either the turbo molecular pump or the dry pump; therefore, by connecting the cryopump 135 to the load/unload chamber 131 that is opened and closed frequently, the throughput can be increased.

The gas supply unit 108 includes a cylinder 110 filled with gases, a pressure adjusting valve 111, a stop valve 112, a mass flow controller 113, and the like. Although not shown here, the cylinder filled with gases includes a cylinder filled with a deposition gas containing silicon or germanium, a cylinder filled with hydrogen, a cylinder filled with a dilution gas, a cylinder filled with a reactive gas (an oxidizing gas, a nitriding gas, a halogen gas, or the like), a cylinder filled with a gas containing an impurity element imparting one conductivity type, and the like.

Each reaction chamber is connected to a high-frequency electric power supplying unit for generating plasma. The high-frequency electric power supplying unit includes at least the high-frequency power source 104 and the matching box 106.

Each reaction chamber can be used for a different purpose depending on the kinds of thin films to be formed. Since each thin film has an optimum temperature for formation, the reaction chambers are provided separately, so that formation temperatures of films to be formed can be easily controlled. Further, the same kind of films can be formed repeatedly, so that an influence of residual impurities due to a film which has been formed can be eliminated.

In the reaction chamber 100b of the plasma CVD apparatus illustrated in FIG. 2, mean free paths of an electron and a molecule become short, a probability that an electron collides with a gas molecule in plasma is increased, and a reaction probability is increased in the following manner: the pressure of the film formation chamber is set higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa; and hydrogen and a deposition gas containing silicon or germanium is introduced into the reaction chamber as a source gas to supply high-frequency power to the first electrode 101 so that glow discharge is generated. Therefore, an active radical is easily generated in plasma. In particular, short-life active radicals are generated in a region where plasma density is high and are reacted in a gas phase, whereby nuclei are formed. When nuclei are formed, successive reaction proceeds in a gas phase that promotes a deposition precursor of nanometer size. Such discharge at a pressure higher than the film formation pressure of the conventional microcrystalline semiconductor film is easily generated in the case where a distance between the first electrode 101 and the second electrode 102 is short, which is typically greater than or equal to 4 mm and less than or equal to 16 mm, preferably, greater than or equal to 5 mm and less than or equal to 10 mm. Note that, here, the distance between the first electrode 101 and the second electrode 102 refers to an interval between a projected portion 141 of the first electrode 101 and the second electrode 102.

When the nucleus of the deposition precursor is generated, an active radical adheres to the nucleus and the deposition precursor is grown. A radical necessary for generation of a nucleus is consumed when the nucleus is grown; therefore, generation of another nucleus is suppressed. Thus, as well as the pressure of the reaction chamber, time of supplying electric power (e.g., a pulse width and a pulse repetition rate in pulse wave power) to the first electrode 101, a gas flow rate, and exhaust velocity of gas are controlled, whereby the size and the generation amount of the deposition precursors can be controlled.

Further, the first electrode 101 includes the projected portion 141 and the depressed portion 143, a high-density plasma region can be formed at the apex of the projected portion 141. Therefore, reactivity is increased in the high-density plasma region, and the generation of a nucleus and a deposition precursor can be promoted.

The composition of a deposition precursor can be controlled by selecting the gas to be supplied because radicals generated in plasma are different depending on kinds of gas. Therefore, a deposition precursor having a multilayer structure can also be generated by changing the kind of deposition gas during growth of a deposition precursor. Note that in the case of a deposition gas containing silicon or germanium as a source gas, a deposition precursor is formed using silicon, germanium, or silicon germanium.

Since the deposition precursor is likely to be charged negatively in plasma, the deposition precursor has a property in which cohesion of the deposition precursors are suppressed by Coulomb force. Therefore, in accordance with this embodiment, a deposition precursor which is substantially monodispersed can be obtained with high density.

In the deposition precursor, temperature as well as kinds of radical that contributes to growth is important for the structure thereof. The temperature of the deposition precursor is determined under the influence of the following: incident ions on a surface thereof (a surface of the deposition precursor), kinetic energy of electrons, or release or absorption of energy due to chemical reaction on the surface, heating or cooling due to collision of molecules of a neutral gas, or the like.

For example, in the case where a deposition precursor of silicon is generated, a crystalline structure can be obtained by diluting silane ($SiH_4$) with hydrogen. It is considered that this mechanism is similar to that of surface reaction that occurs in the case where a microcrystalline silicon film is deposited, and that reaction between hydrogen and a radical which is generated by dissociation of silane is mainly contributed to generation of the deposition precursor of silicon, which has a crystalline structure.

Accordingly, well-ordered deposition precursors which are formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, when a microcrystalline semiconductor film is deposited over crystal nuclei, crystals are grown from an interface between a base film and crystal nuclei using well-ordered crystal nuclei as nuclei. Therefore, a microcrystalline semiconductor film having high crystallinity can be formed from the interface between a base film and the microcrystalline semiconductor film. Furthermore, generation rate of a deposition precursor is increased when the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa, and a high-density plasma region is formed in the vicinity of the projected portions. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be improved.

Embodiment 2

Figure 9A:
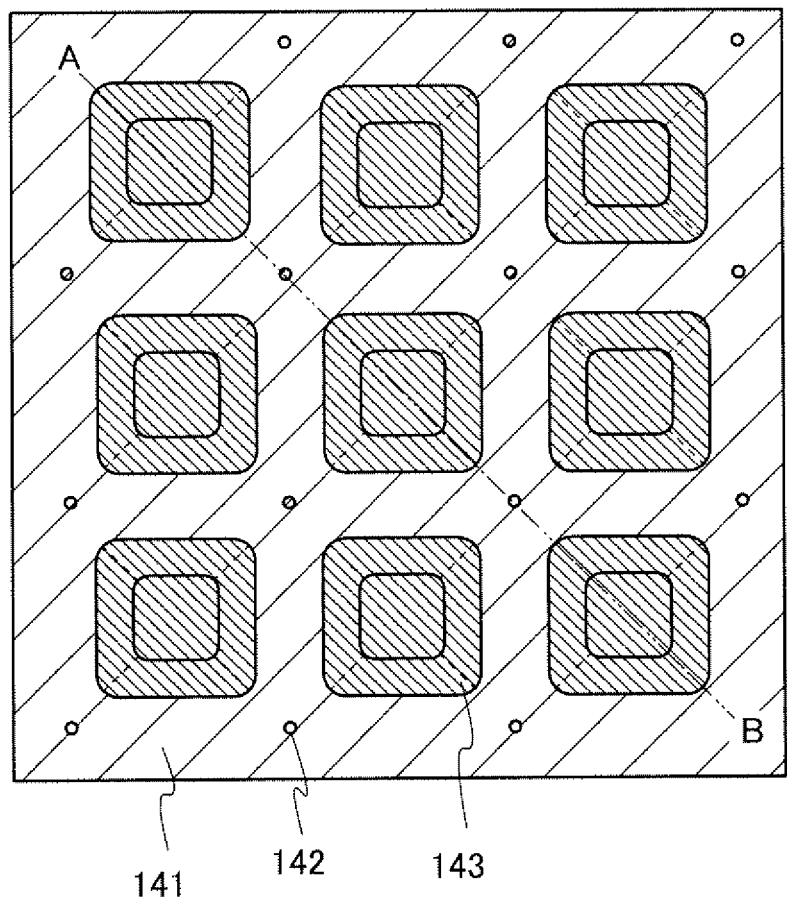
FIGS. 9A and 9B illustrate a shape of an upper electrode of the plasma CVD apparatus.
Figure 9B:
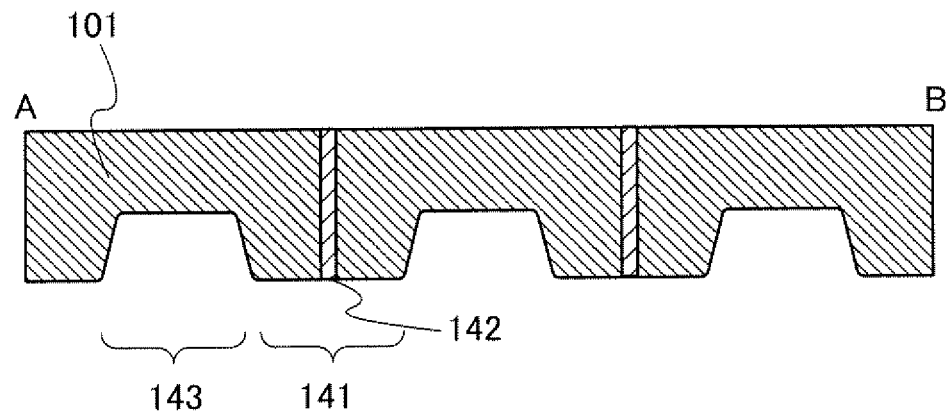

In this embodiment, one mode of the shape of the first electrode 101 is described with reference to FIGS. 9A and 9B. FIG. 9A is a plan view of the first electrode 101 seen from the second electrode 102 side. FIG. 9B is a cross-sectional view taken along A-B in FIG. 9A. Note that in FIG. 9A, regions which are projected to the second electrode side (that is, projected portions) are shown by a wide hatch pattern and regions which are depressed (that is, depressed portions) are shown by a narrow hatch pattern for clear illustration of the state of the projection and depression.

As illustrated in FIGS. 9A and 9B, gas supply ports of hollow portions 142 formed on the common plane are provided regularly, preferably at regular intervals. Further, the gas supply ports of the hollow portions 142 are provided in the projected portions 141. The plurality of depressed portions 143 are separated from one another, and the projected portions 141 form a continuous plane (common plane). Here, the depressed portions 143 each have the shape of a truncated quadrangular pyramid. Note that the shape of the depressed portions 143 is not limited thereto and may be a truncated triangular pyramid, a truncated pentagonal pyramid, a truncated hexagonal pyramid, or any other truncated polygonal pyramid as appropriate. Preferably, the edge and corner of the depressed portion 143 are chamfered to form a truncated polygonal pyramid with the corners rounded. The edge of the depressed portion 143 is preferably chamfered to form a truncated cone with the corners rounded. By chamfering the rounded portions of the edges and corners of the depressed portions 143, overconcentration of an electric field can be reduced. Accordingly, local arc discharge can be suppressed, leading to less generation of particles.

Since the high-density plasma region is formed in the apex of the projected portion 141 by glow discharge, reaction of the source gas introduced into the reaction chamber through the gas supply port of the projected portion 141 is further promoted. Accordingly, generation of the deposition precursor 43 proceeds, whereby a larger number of crystal nuclei 44 can be densely deposited over the base film.

Embodiment 3

In this embodiment, a method for forming a microcrystalline semiconductor film having much higher crystallinity than the microcrystalline semiconductor films in Embodiments 1 and 2 is described.

In this embodiment, as a source gas of the deposition precursor 43 and the microcrystalline semiconductor film 46 in FIGS. 1A and 1B, a rare gas such as argon, xenon, or krypton is used in addition to hydrogen and a deposition gas containing silicon or germanium.

Electron density and the amount of hydrogen radicals in plasma are increased by using a rare gas such as argon, xenon, or krypton, as a source gas, which has low excitation energy and has metastable energy close to dissociation energy of silane and hydrogen. Further, because electron temperature is lowered, potential difference in plasma is reduced and damage to the microcrystalline semiconductor film is reduced, whereby the microcrystalline semiconductor film 46 having high crystallinity is formed. By using a rare gas as the source gas, plasma is stabilized, dissociation of hydrogen and the deposition gas containing silicon or germanium is promoted, and the amount of active radicals is increased. Therefore, reaction between the active radicals is promoted and a generation rate of the deposition precursor 43 and a film-formation rate of the microcrystalline semiconductor film 46 are increased. Further, as the deposition rate is increased, the deposition time of the microcrystalline semiconductor film 46 is shortened and the amount of impurities in a reaction chamber taken in the microcrystalline semiconductor film 46 during deposition is reduced. Consequently, the amount of impurities included in the microcrystalline semiconductor film 46 is reduced, whereby crystallinity of the microcrystalline semiconductor film 46 can be enhanced.

Embodiment 4

In this embodiment, structures of thin film transistors each having a microcrystalline semiconductor film formed by any of the methods described in Embodiments 1 to 3 is described with reference to FIGS. 10A to 10C.

A microcrystalline semiconductor film formed by any of the methods described in Embodiments 1 to 3 can be used as a channel formation region in a thin film transistor. Although the microcrystalline semiconductor film can be used in both a bottom gate thin film transistor and a top gate thin film transistor, the microcrystalline semiconductor film can improve characteristics of the bottom gate thin film transistor particularly. Here, typical structures of the bottom gate thin film transistors are described with reference to FIGS. 10A to 10C.

Figure 10A:
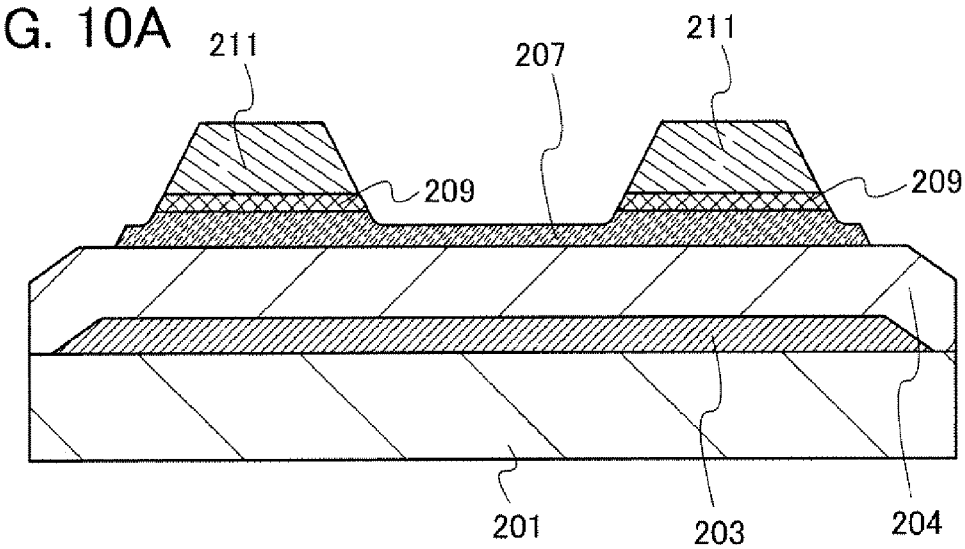
FIGS. 10A to 10C each illustrate a structure of a thin film transistor.

A thin film transistor illustrated in FIG. 10A is a channel etched thin film transistor. A gate electrode 203 is formed over a substrate 201 and an insulating film 204 is formed to cover the substrate 201 and the gate electrode 203. A microcrystalline semiconductor film 207 is formed over the gate insulating film 204. A pair of impurity semiconductor films 209 is formed over the microcrystalline semiconductor film 207. A pair of wirings 211 is formed to be in contact with the pair of impurity semiconductor films 209. By forming the microcrystalline semiconductor film 207 using the microcrystalline semiconductor films described in any of Embodiments 1 to 3, the channel formation region can be formed using a microcrystalline semiconductor film having high crystallinity. Further, crystal grains in the microcrystalline semiconductor film formed according to any of Embodiments 1 to 3 are adjacent to each other and the contact area between the crystal grains is large, so that carriers in the channel formation region can easily move; thus, on current and field-effect mobility of the thin film transistor can be increased.

As the substrate 201, a glass substrate, a ceramic substrate, a plastic substrate that has high heat resistance enough to withstand a process temperature of this manufacturing process, or the like can be used. In the case where the substrate does not need a light-transmitting property, a metal substrate, such as a stainless steel alloy substrate, provided with an insulating film on its surface may be used. As a glass substrate, an alkali-free glass substrate formed using barium borosilicate glass, aluminoborosilicate glass, aluminosilicate glass, or the like may be used. Further, as the glass substrate 201, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 203 can be formed with a single layer or a stacked layer using a metal material such as molybdenum, titanium, chromium, tantalum, tungsten, aluminum, copper, neodymium, or scandium or an alloy material which contains any of these metal materials as its main component. Alternatively, a semiconductor film typified by polycrystalline silicon doped with an impurity element such as phosphorus, or an AgPdCu alloy may be used.

As a two-layer structure for the gate electrode 203, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked is preferable. As a three-layer structure for the gate electrode 203, a stack structure of a tungsten film or a tungsten nitride film, a layer of an alloy of aluminum and silicon or an alloy of aluminum and titanium, and a titanium nitride film or a titanium film is preferable. When a metal film functioning as a barrier film is stacked over a film with low electric resistance, electric resistance can be low and diffusion of a metal element from the metal film into the semiconductor film can be prevented.

In order to improve adhesion between the gate electrode 203 and the substrate 201, a film of a nitride of any of the aforementioned metal materials may be provided between the substrate 201 and the gate electrode 203.

The gate insulating film 204 can be formed with a single layer or a stacked layer using any of a silicon oxide film, a silicon nitride film, a silicon oxynitride film, and a silicon nitride oxide film.

In this specification, silicon oxynitride contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen as composition ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen as composition ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The microcrystalline semiconductor film 207 is typically formed using a microcrystalline silicon film, a microcrystalline silicon germanium film, a microcrystalline germanium film, or the like. Alternatively, a microcrystalline silicon film containing phosphorus, arsenic, or antimony, a microcrystalline silicon germanium film containing phosphorus, arsenic, or antimony, a microcrystalline germanium film containing phosphorus, arsenic, or antimony, or the like may be used. Note that boron may be added to the microcrystalline semiconductor film 207 in order to control a threshold voltage of the thin film transistor.

A microcrystalline semiconductor included in the microcrystalline semiconductor film is a semiconductor having a crystal structure (including a single crystal and a polycrystal). A microcrystalline semiconductor is a semiconductor having a third state that is stable in terms of free energy and is a crystalline semiconductor having short-range order and lattice distortion, in which columnar, conical, or pyramidal crystals having a grain size of 2 nm to 200 nm inclusive, preferably, 10 nm to 80 nm inclusive, more preferably, 20 nm to 50 nm inclusive have grown in a normal direction with respect to a substrate surface. Therefore, a crystal grain boundary is formed at the interface of the columnar, conical, or pyramidal crystals in some cases.

Microcrystalline silicon which is a typical example of the microcrystalline semiconductor has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor may contain hydrogen or halogen of at least 1 at. % or more to terminate a dangling bond. Moreover, a rare gas element such as helium, neon, argon, krypton, or xenon may be contained to further promote lattice distortion, so that stability of the structure of minute crystals is enhanced and a favorable microcrystalline semiconductor can be obtained. Such a microcrystalline semiconductor is disclosed in, for example, U.S. Pat. No. 4,409,134.

The concentrations of oxygen and nitrogen contained in the microcrystalline semiconductor film which are measured by secondary ion mass spectrometry are set to less than $1\times10^{18}$ atoms/cm$^3$, which is preferable since the crystallinity of the microcrystalline semiconductor film 207 can be increased.

In the case of an n-channel thin film transistor, the impurity semiconductor film 209 is formed using amorphous silicon to which phosphorus is added or microcrystalline silicon to which phosphorus is added. In the case of a p-channel thin film transistor, the impurity semiconductor film 209 is formed using amorphous silicon to which boron is added or microcrystalline silicon to which boron is added.

The wirings 211 can be formed as a single layer or a stacked layer using any of aluminum, copper, titanium, neodymium, scandium, molybdenum, chromium, tantalum, tungsten, and the like. Alternatively, an aluminum alloy to which an element for preventing a hillock is added (e.g., an aluminum-neodymium alloy which can be used for the gate electrode 203) may be used. The wirings 211 may also have a stack structure in which a film that is in contact with the impurity semiconductor film 209 is formed using titanium, tantalum, molybdenum, or tungsten, or nitride of any of these elements and aluminum or an aluminum alloy is formed thereover. Furthermore, a stacked layer structure may also be employed in which upper and lower surfaces of aluminum or an aluminum alloy may each be covered with titanium, tantalum, molybdenum, tungsten, or nitride of any of these elements.

Figure 10B:
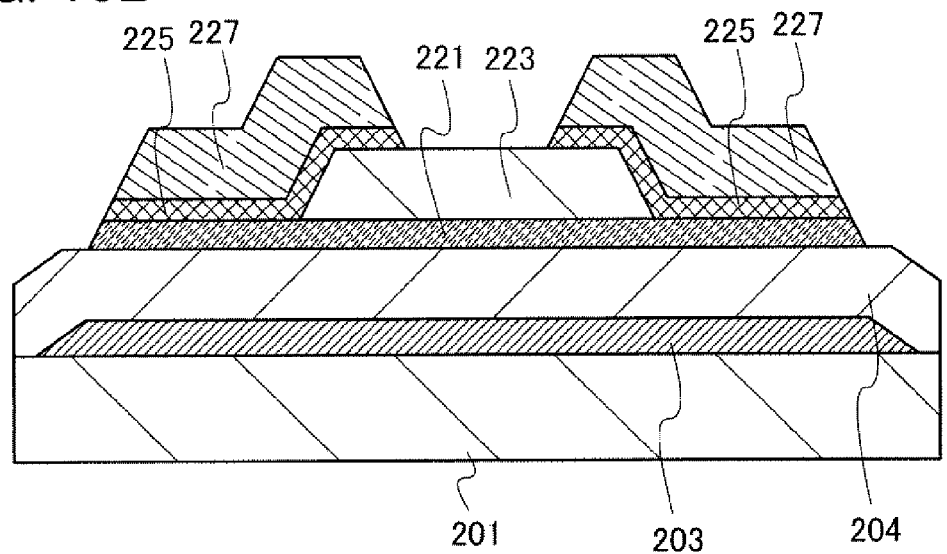

A thin film transistor illustrated in FIG. 10B is a channel stop thin film transistor. The gate electrode 203 is formed over the substrate 201, and the gate insulating film 204 is formed to cover the substrate 201 and the gate electrode 203. A microcrystalline semiconductor film 221 is formed over the gate insulating film 204. A channel protective film 223 is formed over the microcrystalline semiconductor film 221. A pair of impurity semiconductor films 225 is formed over the microcrystalline semiconductor film 221 and the channel protective film 223. A pair of wirings 227 is formed to be in contact with the pair of impurity semiconductor films 225. By forming the microcrystalline semiconductor film 221 using any of the methods for forming a microcrystalline semiconductor film described in Embodiments 1 to 3, the channel formation region can be formed using a microcrystalline semiconductor film having high crystallinity. Crystal grains in the microcrystalline semiconductor film formed according to any of Embodiments 1 to 3 are adjacent to each other and the contact area between the crystal grains is large, so that carriers in the channel formation region can easily move; thus, on current and field-effect mobility of the thin film transistor can be increased.

The channel protective film 223 can be formed in a manner the same as or similar to that of the gate insulating film 204. Alternatively, a polyimide, an epoxy resin, an acrylic resin, or another organic insulating film can be used to form the channel protective film 223.

The pair of impurity semiconductor films 225 can be formed using a material and a structure which are the same as or similar to those of the pair of impurity semiconductor films 209 illustrated in FIG. 10A.

The pair of wirings 227 can be formed using a material and a structure which are the same as or similar to those of the pair of wirings 211 illustrated in FIG. 10A.

A channel protective thin film transistor is formed using the microcrystalline semiconductor film described in any of Embodiments 1 to 3 for a channel formation region and includes the channel protective film, so that on current and field-effect mobility of the thin film transistor can be increased while off current is reduced.

Figure 10C:
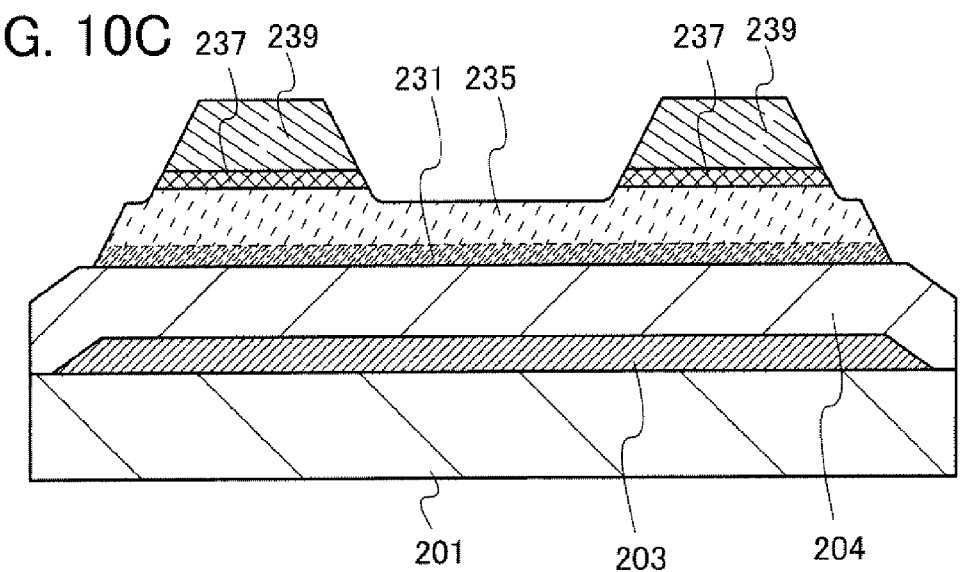

A thin film transistor illustrated in FIG. 10C is a channel etched thin film transistor and includes an amorphous semiconductor film 235 between a microcrystalline semiconductor film 231 and a pair of impurity semiconductor films 237, which is different from the structures of FIGS. 10A and 10B.

The gate electrode 203 is formed over the substrate 201, and the gate insulating film 204 is formed to cover the substrate 201 and the gate electrode 203. The microcrystalline semiconductor film 231 is formed over the gate insulating film 204. An amorphous semiconductor film 235 is formed over the microcrystalline semiconductor film 231. The pair of impurity semiconductor films 237 is formed over the amorphous semiconductor film 235. A pair of wirings 239 is formed to be in contact with the pair of the impurity semiconductor films 237. By forming the microcrystalline semiconductor film 231 using the any of the methods for forming a microcrystalline semiconductor film described in Embodiments 1 to 3, the channel formation region can be formed using a microcrystalline semiconductor film having high crystallinity. Further, crystal grains in the microcrystalline semiconductor film formed according to any of Embodiments 1 to 3 are adjacent to each other and the contact area between the crystal grains is large, so that carriers in the channel formation region can easily move; thus, on current and field-effect mobility of the thin film transistor can be increased.

The amorphous semiconductor film 235 can be formed using amorphous silicon, amorphous silicon containing nitrogen, amorphous silicon containing chlorine, or the like. The amorphous semiconductor film 235 is provided between the microcrystalline semiconductor film 231 and the pair of impurity semiconductor films 237, so that off current of the thin film transistor can be reduced.

As the amorphous semiconductor film 235, a semiconductor film having a peak region of a spectrum obtained by low-temperature photoluminescence spectroscopy of 1.31 eV to 1.39 eV inclusive can be used. As the amorphous semiconductor film 235, a semiconductor film which has a low energy at an urbach edge measured by a constant photocurrent method (CPM) or photoluminescence spectroscopy and a small amount of absorption spectra of defects can be formed. That is, as compared with the conventional amorphous semiconductor film, the amorphous semiconductor is a well-ordered semiconductor which has fewer defects and whose tail of a level at a band edge in the valence band is steep. Since the tail of the level at the band edge in the valence band is steep in the amorphous semiconductor film, the band gap gets wider, and tunneling current does not easily flow. Thus, when the amorphous semiconductor film is provided on the back channel side, on current and field-effect mobility can be increased while off current of the thin film transistor is reduced.

The pair of impurity semiconductor films 237 can be formed using a material and a structure which are the same as or similar to those of the pair of impurity semiconductor films 209 illustrated in FIG. 10A.

The pair of wirings 239 can be formed using a material and a structure which are the same as or similar to those of the pair of wirings 211 illustrated in FIG. 10A.

The thin film transistor illustrated in FIG. 10C is formed using the microcrystalline semiconductor film described in any of Embodiments 1 to 3 as a channel formation region and includes the amorphous semiconductor film 235, so that on current and field-effect mobility of the thin film transistor can be increased while off current is reduced.

Embodiment 5

In this embodiment, an element substrate and a display device including the element substrate to which the thin film transistor described in Embodiment 4 can be applied are described below. As examples of the display device, a liquid crystal display device, a light-emitting display device, electronic paper, and the like are given. The thin film transistor described in the above embodiment can be used for an element substrate of any other display devices. Here, a liquid crystal display device including the thin film transistor described in Embodiment 5, typically, a vertical alignment (VA) mode liquid crystal display device is described with reference to FIG. 11 and FIG. 12.

Figure 11:
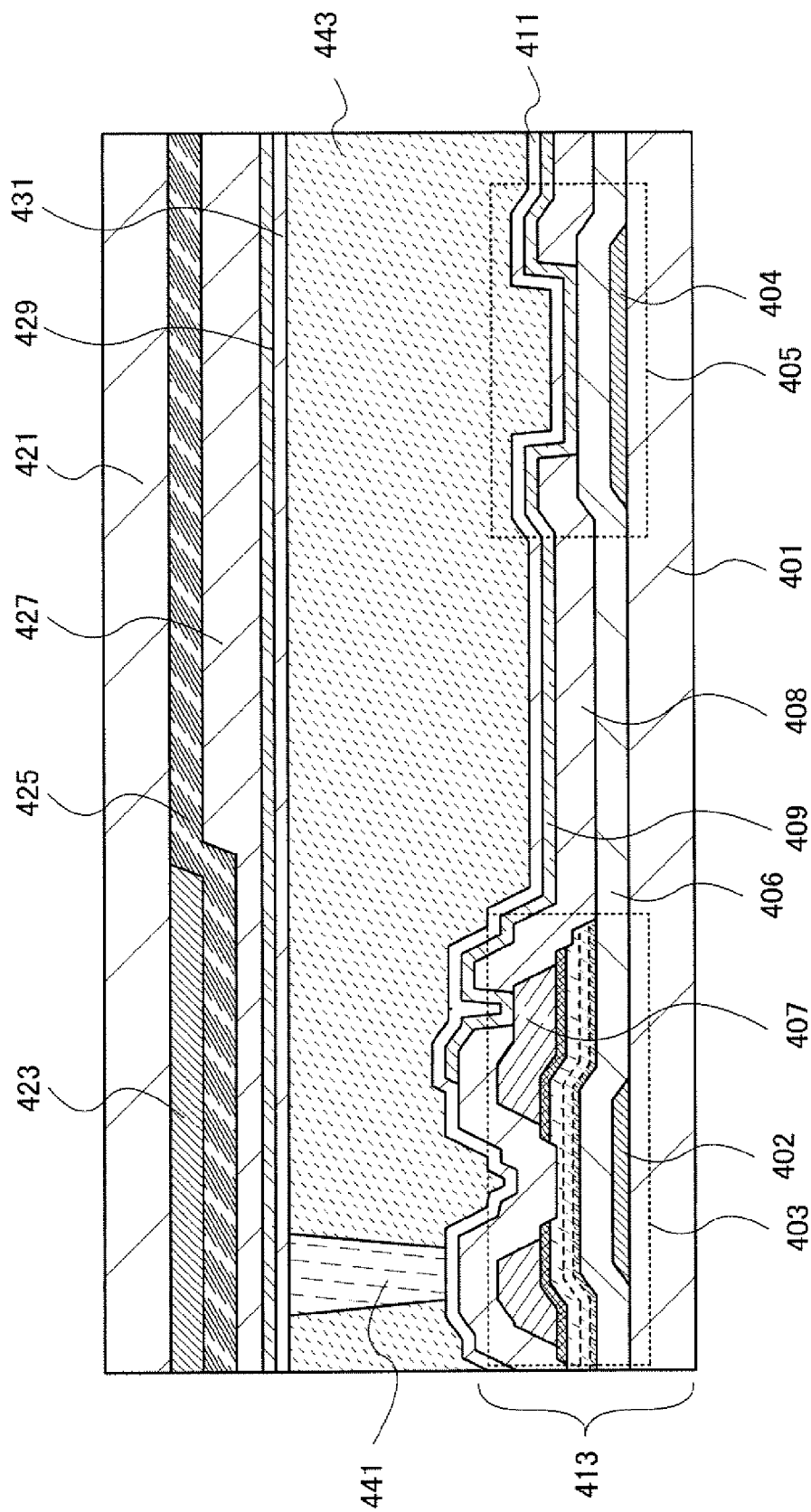
FIG. 11 illustrates a display device.

FIG. 11 illustrates a cross-sectional structure of a pixel portion of a liquid crystal display device. A thin film transistor 403 manufactured according to the above embodiment and a capacitor 405 are formed over a substrate 401. Further, a pixel electrode 409 is formed over an insulating film 408 which is formed over the thin film transistor 403. A source or drain electrode 407 of the thin film transistor 403 and the pixel electrode 409 are connected to each other in an opening formed in the insulating film 408. An alignment film 411 is formed over the pixel electrode 409.

The capacitor 405 includes a capacitor wiring 404 which is formed at the same time as a gate electrode 402 of the thin film transistor 403, a gate insulating film 406, and the pixel electrode 409.

A stack body including components from the substrate 401 to the alignment film 411 is referred to as an element substrate 413.

A counter substrate 421 is provided with a coloring film 425 and a light-blocking film 423 for blocking incidence of light into the thin film transistor 403. In addition, a planarizing film 427 is formed adjacent to the light-blocking film 423 and the coloring film 425. A counter electrode 429 is formed adjacent to the planarizing film 427, and an alignment film 431 is formed adjacent to the counter electrode 429.

Note that the light-blocking film 423, the coloring film 425, and the planarizing film 427 adjacent to the counter substrate 421 function as a color filter. Note that one of or both the light-blocking film 423 and the planarizing film 427 are not necessarily formed adjacent to the counter substrate 421.

The coloring film has a function of preferentially transmitting light of a predetermined wavelength range, among light of a wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined for a color filter. However, the combination of the coloring films is not limited to the above combination.

The substrate 401 and the counter substrate 421 are fixed to each other by a sealing material (not illustrated), and a liquid crystal layer 443 fills a space surrounded by the substrate 401, the counter substrate 421, and the sealing material. Further, a spacer 441 is provided to keep a distance between the substrate 401 and the counter substrate 421.

The pixel electrode 409, the liquid crystal layer 443, and the counter electrode 429 are overlapped with each other, whereby a liquid crystal element is formed.

Figure 12:
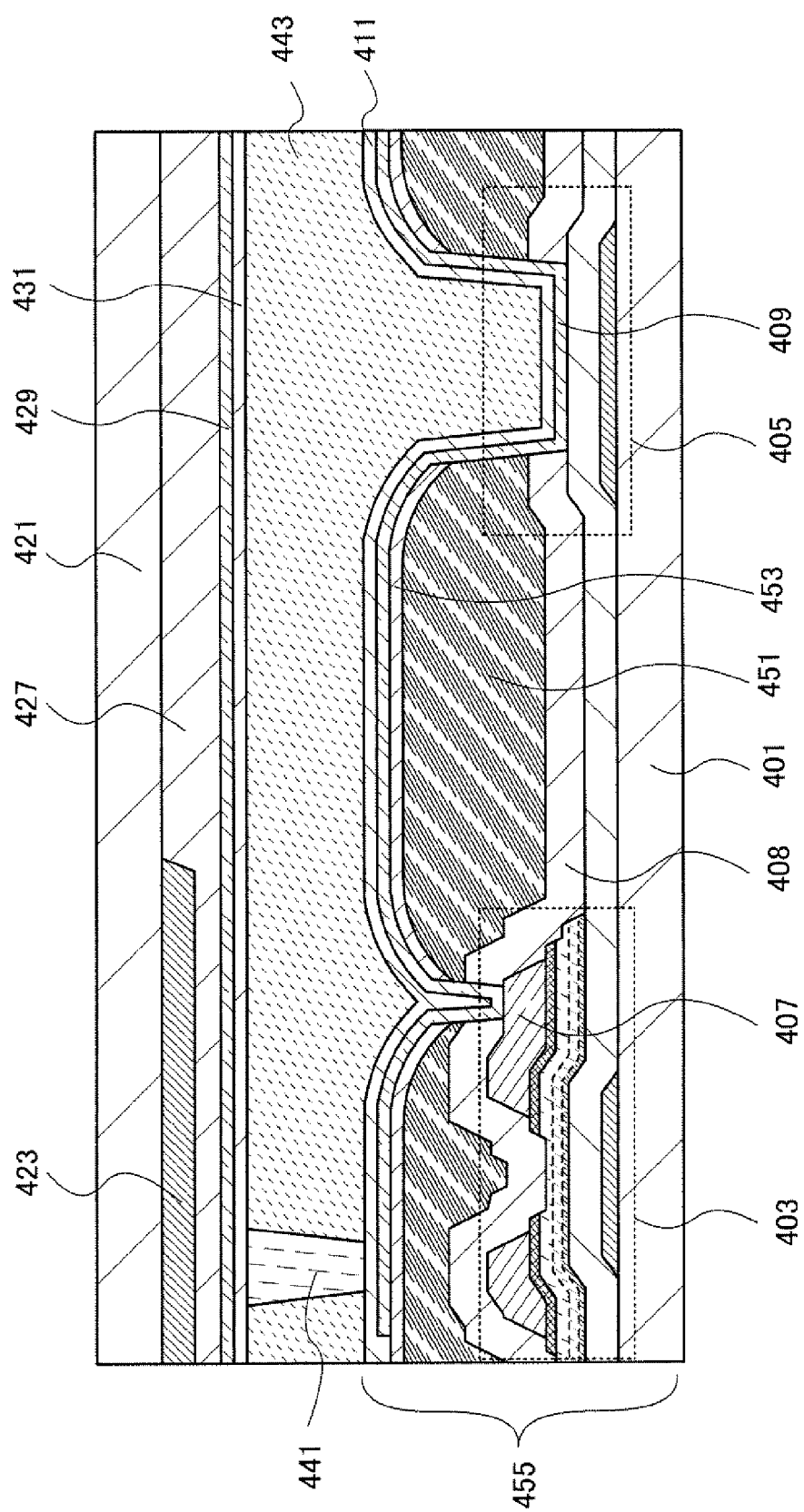
FIG. 12 illustrates a display device.

FIG. 12 illustrates a liquid crystal display device different from that in FIG. 11. Here, a coloring film is formed not on the counter substrate 421 side but over a substrate 401 provided with a thin film transistor 403.

FIG. 12 illustrates a cross-sectional structure of a pixel portion of a liquid crystal display device. The thin film transistor 403 manufactured according to the above embodiment and a capacitor 405 are formed over the substrate 401.

Further, a coloring film 451 is formed over the insulating film 408 which is formed over the thin film transistor 403. Further, a protective film 453 is formed over the coloring film 451 in order to prevent an impurity contained in the coloring film 451 from being mixed into a liquid crystal layer 443. A pixel electrode 409 is formed over the coloring film 451 and the protective film 453. As the coloring film 451, a film which preferentially transmits light of a predetermined wavelength range (red light, blue light, or green light) may be formed for each pixel. Further, since the coloring film 451 also functions as a planarizing film, uneven alignment of the liquid crystal layer 443 can be suppressed.

A source or drain electrode 407 of the thin film transistor 403 and the pixel electrode 409 are connected to each other in an opening formed in the insulating film 408, the coloring film 451, and the protective film 453. An alignment film 411 is formed over the pixel electrode 409.

The capacitor 405 includes a capacitor wiring 404 which is formed at the same time as a gate electrode 402 of the thin film transistor 403, a gate insulating film 406, and the pixel electrode 409.

A stack body including components from the substrate 401 to the alignment film 411 is referred to as an element substrate 455.

The counter substrate 421 is provided with a light-blocking film 423 for blocking incidence of light into the thin film transistor 403 and a planarizing film 427 covering the light-blocking film 423 and the counter substrate 421. A counter electrode 429 is formed adjacent to the planarizing film 427, and an alignment film 431 is formed adjacent to the counter electrode 429.

The pixel electrode 409, the liquid crystal layer 443, and the counter electrode 429 are overlapped with each other, whereby a liquid crystal element is formed.

Note that although the VA liquid crystal display device is described here as a liquid crystal display device, the present invention is not limited thereto. That is, an element substrate which is formed using the thin film transistor in accordance with Embodiment 4 can also be applied to an FFS mode liquid crystal display device, an IPS mode liquid crystal display device, a TN mode liquid crystal display device, and other modes of liquid crystal display devices.

Since the thin film transistor with large on current, high field-effect mobility, and small off current is used as a pixel transistor in the liquid crystal display device of this embodiment, image quality (e.g., contrast) of the liquid crystal display device can be improved. Further, electric characteristics of the thin film transistor is not degraded even when the thin film transistor is downsized; therefore, by reducing the size of the thin film transistor, the aperture ratio of the liquid crystal display device can be increased. Alternatively, the area of a pixel can be reduced, so that resolution of the liquid crystal display device can be improved.

Further, in the liquid crystal display device illustrated in FIG. 12, the light-blocking film 423 and the coloring film 451 are not formed over the same substrate. Therefore, misalignment of a mask in formation of the coloring film 451 can be prevented. Accordingly, the area of the light-blocking film 423 is not necessarily increased, which can increase the aperture ratio of the pixel.

Embodiment 6

By being provided with a light-emitting element without formation of the alignment film 411 and the like, the element substrate 413 or 455 described in Embodiment 5 can be used for a light-emitting display device or a light-emitting device. In a light-emitting display device or a light-emitting device, a light-emitting element utilizing electroluminescence is typically used as a light-emitting element. Light-emitting elements utilizing electroluminescence are classified according to whether a light-emitting material is an organic compound or an inorganic compound. In general, the former is referred to as organic EL elements and the latter as inorganic EL elements.

In the light-emitting display device or the light-emitting device of this embodiment, a thin film transistor with large on-current, high field-effect mobility, and small off-current is used as a pixel transistor; therefore, the light-emitting display device or the light-emitting device can have favorable image quality (for example, high contrast) and low power consumption.

Embodiment 7

A display device including the thin film transistor according to any of the above embodiments can be applied to a variety of electronic devices (including an amusement machine). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. In particular, as described in Embodiments 5 and 6, the thin film transistor according to any of the above embodiments can be applied to a liquid crystal display device, a light-emitting device, an electrophoretic display device, or the like and thus can be used for a display portion of an electronic device. Specific examples will be described below.

A semiconductor device including the thin film transistor according to any of the above embodiments can be applied to electronic paper. Electronic paper can be used for electronic devices of a variety of fields as long as they can display data. For example, electronic paper can be applied to an electronic book (e-book) device, a poster, an advertisement in a vehicle such as a train, a digital signage, a public information display (PID), displays of various cards such as a credit card, and the like. Examples of such electronic devices are illustrated in FIGS. 13A to 13D.

Figure 13A:
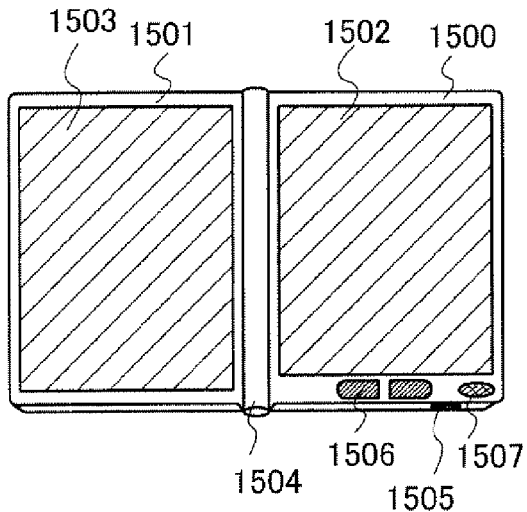
FIGS. 13A to 13D each illustrate an electronic device to which a thin film transistor is applied.

FIG. 13A illustrates an example of the electronic book device. For example, the electronic book device includes two housings, a housing 1500 and a housing 1501. The housing 1500 and the housing 1501 are combined by a hinge 1504 so that the electronic book device can be opened and closed. With such a structure, the electronic book device can operate like a paper book.

A display portion 1502 and a display portion 1503 are incorporated in the housing 1500 and the housing 1501, respectively. The display portion 1502 and the display portion 1503 may be configured to display one image or different images. In the case where the display portion 1502 and the display portion 1503 display different images, for example, a display portion on the right side (the display portion 1502 in FIG. 13A) can display text and a display portion on the left side (the display portion 1503 in FIG. 13A) can display graphics.

FIG. 13A illustrates an example in which the housing 1500 is provided with an operation portion and the like. For example, the housing 1500 is provided with a power source 1505, an operation key 1506, a speaker 1507, and the like. With the operation key 1506, pages can be turned. Note that a keyboard, a pointing device, and the like may be provided on the same surface as the display portion of the housing. Furthermore, an external connection terminal (an earphone terminal, a USB terminal, a terminal that can be connected to various cables including an AC adapter and a USB cable, or the like), a recording medium insertion portion, and the like may be provided on the back surface or the side surface of the housing. Further, the electronic book device illustrated in FIG. 13A may have a function of an electronic dictionary.

The electronic book device illustrated in FIG. 13A may transmit and receive data wirelessly. Through wireless communication, desired book data or the like can be purchased and downloaded from an electronic book server.

Figure 13B:
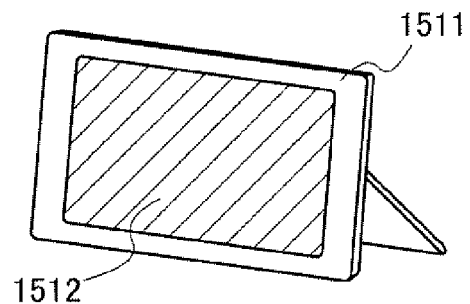

FIG. 13B illustrates an example of the digital photo frame. For example, in the digital photo frame of FIG. 13B, a display portion 1512 is incorporated in a housing 1511. Various images can be displayed in the display portion 1512. For example, the display portion 1512 can display data of an image shot by a digital camera or the like to function as a normal photo frame.

Note that the digital photo frame illustrated in FIG. 13B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a storage medium having image data taken with a digital camera is inserted into the storage medium inserting portion of the digital photo frame and the image data is imported, whereby the imported image data can be displayed on the display portion 1512.

Further, the digital photo frame illustrated in FIG. 13B may transmit and receive data wirelessly. The structure may be employed in which desired image data is transferred wirelessly to be displayed.

Figure 13C:
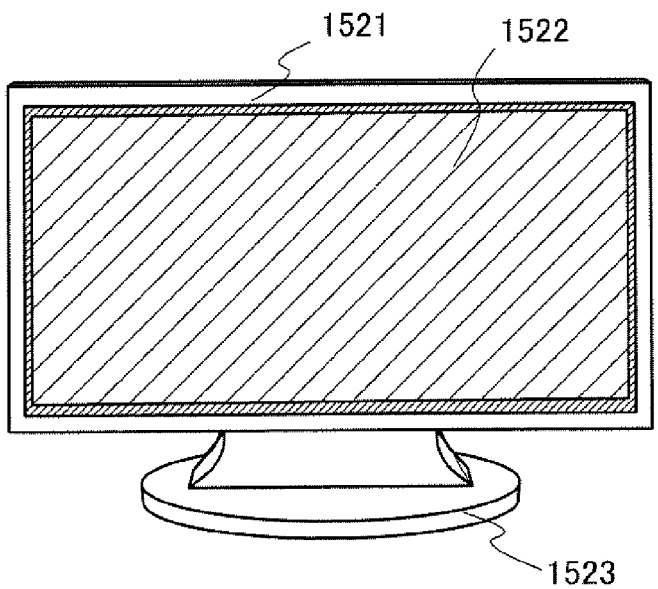

FIG. 13C illustrates an example of the television device. In the television set, a display portion 1522 is incorporated in a housing 1521. The display portion 1522 can display an image. Further, the housing 1521 is supported by a stand 1523 here. The display device described in Embodiment 5 or Embodiment 6 can be applied to the display portion 1522.

The television device illustrated in FIG. 13C can be operated with an operation switch of the housing 1521 or a separate remote controller. Channels and volume can be controlled with an operation key of the remote controller so that an image displayed in the display portion 1522 can be controlled. Further, the remote controller may be provided with a display portion for displaying data output from the remote controller.

Note that the television device may be provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 13D:
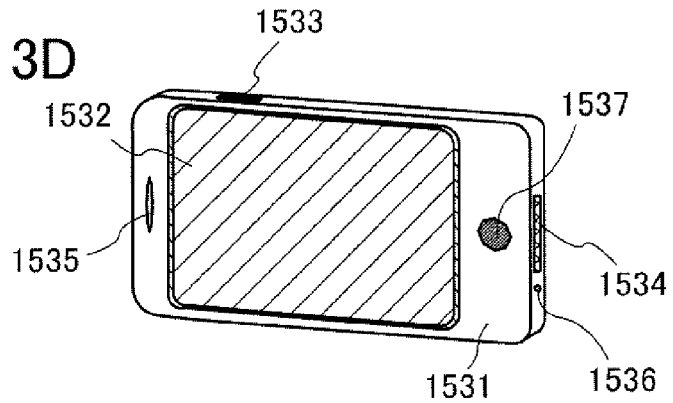

FIG. 13D illustrates an example of the mobile phone. The mobile phone is provided with a display portion 1532 incorporated in a housing 1531, an operation button 1533, an operation button 1537, an external connection port 1534, a speaker 1535, a microphone 1536, and the like. Any of the display devices described in Embodiments 5 and 6 can be applied to the display portion 1532.

The display portion 1532 of the mobile phone illustrated in FIG. 13D is a touch panel. When the display portion 1532 is touched with a finger or the like, contents displayed in the display portion 1532 can be controlled. Further, operations such as making calls and composing mails can be performed by touching the display portion 1532 with a finger or the like.

There are mainly three screen modes for the display portion 1532. The first mode is a display mode mainly for displaying images. The second mode is an input mode mainly for inputting data such as text. The third mode is a display-and-input mode in which two modes of the display mode and the input mode are combined.

For example, in the case where a call is made or a mail is composed, a text input mode mainly for inputting text is selected for the display portion 1532 so that characters displayed on a screen can be input. In that case, it is preferable to display a keyboard or number buttons on a large area of the screen of the display portion 1532.

When a detection device including a sensor for detecting inclination, such as a gyroscope or an acceleration sensor, is provided inside the mobile phone, the mode (or display data) of the display portion 1532 can be automatically switched by determining the orientation of the mobile phone (whether the mobile phone is placed horizontally or vertically).

The screen modes are switched by touching the display portion 1532 or using the operation button 1537 of the housing 1531. Alternatively, the screen modes can be switched depending on kinds of images displayed in the display portion 1532. For example, when a signal of an image displayed in the display portion is moving image data, the screen mode can be switched to the display mode. When the signal is text data, the screen mode can be switched to the input mode.

Further, in the input mode, when input by touching the display portion 1532 is not performed for a certain period of time while a signal detected by an optical sensor in the display portion 1532 is detected, the screen mode may be controlled so as to be switched from the input mode to the display mode.

The display portion 1532 can also function as an image sensor. For example, an image of a palm print, a fingerprint, or the like is taken by an image sensor when the display portion 1532 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in appropriate combination with any of the structures described in the other embodiments.

Embodiment 8

In this embodiment, one mode of a photoelectric conversion device is described. In the photoelectric conversion device described in this embodiment, the microcrystalline semiconductor film having high crystallinity which is formed by any of the methods described in Embodiments 1 to 3 is applicable to a semiconductor film effective in photoelectric conversion, a semiconductor film having a conductivity type, or the like, and is preferably applied to a semiconductor film effective in photoelectric conversion in particular.

By employing the structure as described above, resistance (series resistance) caused by the semiconductor film effective in photoelectric conversion or the semiconductor film having a conductivity type can be reduced, resulting in improvement of properties of the photoelectric conversion device. With reference to FIGS. 14A to 14D and FIG. 15, one mode of a method for manufacturing a photoelectric conversion device will now be described.

As illustrated in FIG. 14A, a first electrode 302 is formed over a substrate 300.

As the substrate 300, any of a variety of glass substrates used in the electronics industry, such as a substrate of aluminosilicate glass, a barium borosilicate glass, aluminoborosilicate glass, or the like is typically used. Alternatively, a quartz substrate, a sapphire substrate, or the like can be used. Further alternatively, a substrate containing an organic material can be used. As the substrate containing the organic material, it is preferable to use a substrate containing a thermosetting resin such an epoxy resin, unsaturated polyester resin, a polyimide resin, a bismaleimide-triazine resin, or a cyanate resin, or a substrate containing a thermoplastic resin such as a polyphenylene oxide resin, a polyetherimide resin, or a fluorine resin.

Note that a surface of the substrate 300 may have a texture structure which is capable of improving the photoelectric conversion efficiency.

In this embodiment, since light enters from the back side (the lower part in the drawing) of the substrate 300, a light-transmitting substrate is used. However, the present invention is not limited thereto in the case where light enters from the second electrode side (the upper part in the drawing); in this case, a semiconductor substrate containing a material such as silicon or a conductive substrate containing a metal material or the like may be used.

For the first electrode 302, an electrode using a light-transmitting conductive material is typically used. Examples of light-transmitting conductive materials include oxides (metal oxides) such as In—Sn—Zn—O-based oxide, In—Al—Zn—O-based oxide, Sn—Ga—Zn—O-based oxide, Al—Ga—Zn—O-based oxide, Sn—Al—Zn—O-based oxide, In—Zn—O-based oxide, Sn—Zn—O-based oxide, Al—Zn—O-based oxide, In—O-based oxide, Sn—O-based oxide, and Zn—O-based oxide. In particular, it is preferable to use indium oxide, an indium oxide-tin alloy (ITO), zinc oxide, an indium oxide-zinc oxide alloy, or the like. Alternatively, a Zn—O—Al—N-based material can be used. Further, the light-transmitting conductive material is not limited to an inorganic material, and may be an organic material. As an organic material, it is possible to use a material such as polyaniline, polypyrrole, polythiophene, or a derivative thereof (a conductive high molecular material). The first electrode 302 is formed by a sputtering method, a CVD method, a vacuum evaporation method, a coating method, a printing method, or the like.

The first electrode 302 is formed to a thickness of 10 nm to 500 nm, preferably 50 nm to 100 nm. The sheet resistance of the first electrode 302 is set to about 20 Ω/sq. to 200 Ω/sq.

Note that in this embodiment, since light enters from the back side (the lower part in the drawing) of the substrate 300, the first electrode 302 is formed using a light-transmitting conductive material. However, the present invention is not limited thereto in the case where light enters from the second electrode side (the upper part in the drawing). In such a case, the first electrode 302 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the surface of the substrate 300, a surface of the first electrode 302 may have a texture structure. Further, an auxiliary electrode formed using a low-resistant conductive material may be separately formed so as to be in contact with the first electrode 302.

Next, as illustrated in FIG. 14B, a semiconductor film 304 having a first conductivity type is formed over the first electrode 302, a semiconductor film 306 effective in photoelectric conversion is formed over the semiconductor film 304 having the first conductivity type, and a semiconductor film 308 having a second conductivity type is formed over the semiconductor film 306 effective in photoelectric conversion.

The semiconductor film 304 having the first conductivity type is typically formed using a semiconductor film containing a semiconductor material to which an impurity element imparting a conductivity type is added. Silicon is suitable for the semiconductor material, considering productivity, a price, or the like. When silicon is used as the semiconductor material, phosphorus or arsenic, which imparts n-type conductivity, aluminum or boron, which imparts p-type conductivity, or the like is used as the impurity element imparting a conductivity type.

In this embodiment, since light enters from the back side (the lower part in the drawing) of the substrate 300, the conductivity type (first conductivity type) of the semiconductor film 304 having the first conductivity type is preferably a p-type. This is because, for instance, the diffusion length of holes is short as a result of the lifetime of a hole which is as short as half that of an electron, and because more electrons and holes are formed on the side where light enters in the semiconductor film effective in photoelectric conversion. By applying a p-type to the first conductivity type, a current can be extracted before holes are annihilated, whereby a decrease of photoelectric conversion efficiency can be suppressed. Note that when there is no possibility of the above problems, for example, when the semiconductor film effective in photoelectric conversion is sufficiently thin, the first conductivity type may be an n-type.

Although there is no limitation on the crystallinity of the semiconductor film 304 having the first conductivity type, the microcrystalline semiconductor film having high crystallinity which is formed by any of the methods described in Embodiments 1 to 3 is preferably used as the semiconductor film 304. This is because in this case, as compared with use of a conventional microcrystalline semiconductor film, it is possible to reduce series resistance and to suppress optical and electrical loss at the interface between the semiconductor film 304 having the first conductivity type and another film. It is needless to say that other semiconductors such as an amorphous semiconductor, a polycrystalline semiconductor, and a single crystal semiconductor can also be used.

Like the surface of the substrate 300, a surface of the semiconductor film 304 having the first conductivity type may have a texture structure.

The semiconductor film 304 having the first conductivity type can be formed using a deposition gas containing silicon and diborane by a plasma CVD method. Further, the semiconductor film 304 having the first conductivity type is formed to a thickness of 1 nm to 100 nm, preferably 5 nm to 50 nm.

Alternatively, the semiconductor film 304 having the first conductivity type may be formed in a manner such that a silicon film to which an impurity element imparting a conductivity type is not added is formed by a plasma CVD method or the like, followed by addition of boron by an ion implantation method or the like.

The semiconductor film 306 effective in photoelectric conversion is formed. As the semiconductor film effective in photoelectric conversion, silicon, silicon germanium, or the like is used as a semiconductor material.

Here, as a method of forming the semiconductor film 306 effective in photoelectric conversion, the process for forming the microcrystalline semiconductor film described in Embodiments 1 to 3 is used. By applying the microcrystalline semiconductor film described in Embodiments 1 to 3 to the semiconductor film 306 effective in photoelectric conversion, optical and electrical loss at the interface between the semiconductor film 304 and another film can be suppressed as compared with the use of the conventional microcrystalline semiconductor film.

Because the semiconductor film 306 effective in photoelectric conversion needs to realize sufficient light absorption, it preferably has a thickness of about 100 nm to 10 μm.

In this embodiment, the second conductivity type is an n-type. The semiconductor film 308 having the second conductivity type can be formed using a material such as silicon to which phosphorus is added as an impurity element imparting a conductivity type. Semiconductor materials that can be used for the semiconductor film 308 having the second conductivity type are the same as those for the semiconductor film 304 having the first conductivity type.

The semiconductor film 308 having the second conductivity type can be formed like the semiconductor film 304 having the first conductivity type. For instance, the semiconductor film 308 can be formed using a deposition gas containing silicon and phosphine by a plasma CVD method. Also as the semiconductor film 308 having the second conductivity type, it is preferable to use the microcrystalline semiconductor film having high crystallinity which is formed by any of the methods described in Embodiments 1 to 3.

In this embodiment, since light enters from the back side (the lower part in the drawing) of the substrate 300, the conductivity type (second conductivity type) of the semiconductor film 308 having the second conductivity type is preferably an n-type, but an embodiment of the present invention is not limited thereto. When the first conductivity type is an n-type, the second conductivity type is a p-type.

Through the above process, a unit cell 310 which has the semiconductor film 304 having the first conductivity type, the semiconductor film 306 effective in photoelectric conversion, and the semiconductor film 308 having the second conductivity type is completed.

In order to form a plurality of unit cells over one substrate, openings $C_0$ to $C_n$ penetrating through the unit cell 310 and the first electrode 302 are formed by a laser processing method. By this step, the first electrode 302 is divided into first electrodes $T_1$ to $T_n$. Further, the unit cell 310 is divided into unit cells $K_1$ to $K_n$ (see FIG. 14C).

The openings $C_0$, $C_2$, $C_4$, ..., $C_{n-2}$, $C_n$ are openings for insulation. The openings $C_1$, $C_3$, $C_5$, ..., $C_{n-1}$ are openings for forming connection between the first electrode 302 and a second electrode formed later. By performing laser processing with the first electrode 302 and the unit cell 310 stacked, separation of the first electrode 302 from the substrate 300 can be prevented in the processing.

Next, insulating resin layers $Z_0$ to $Z_n$ for filling the openings $C_0$, $C_2$, $C_4$, ..., $C_{n-2}$, $C_n$ and covering upper end portions of these openings are formed (see FIG. 14D). The insulating resin layers $Z_0$ to $Z_n$ may be formed using a resin material having an insulating property such as an acrylic-based resin, a phenol-based resin, an epoxy-based resin, or a polyimide-based resin by a screen printing method. For example, an insulating resin pattern is formed by a screen printing method so that the openings $C_0$, $C_2$, $C_4$, ..., $C_{n-2}$, $C_n$ are filled with a resin composition in which cyclohexane, isophorone, high resistance carbon black, aerosil, a dispersing agent, a defoaming agent, and a leveling agent are mixed with a phenoxy resin. After the insulating resin pattern is formed, thermal hardening is performed in an oven at 160° C. for 20 minutes. Thus, the insulating resin layers $Z_0$ to $Z_n$ are obtained.

Figure 15:
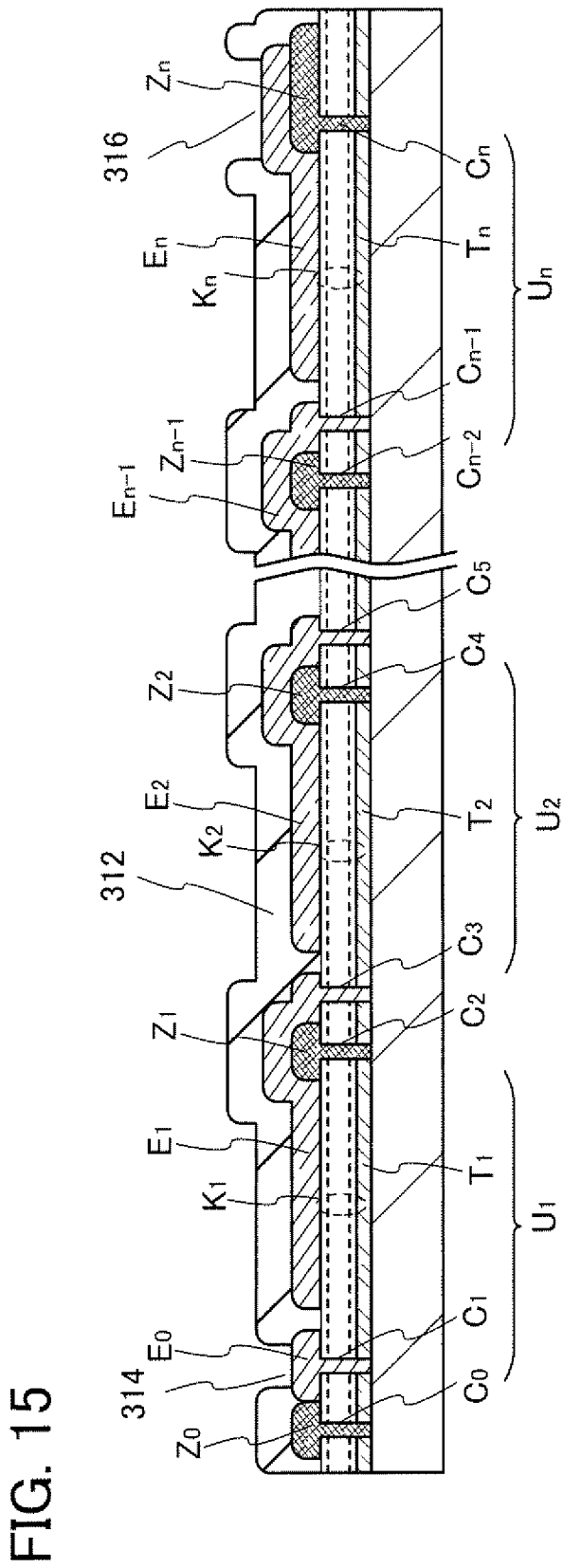
FIG. 15 illustrates the method for manufacturing the photoelectric conversion device.

Next, the second electrodes $E_0$ to $E_n$ are formed (see FIG. 15). The second electrodes $E_0$ to $E_n$ are formed using a conductive material such as metal. They can be formed using a material that easily reflects light, such as aluminum, silver, titanium, or tantalum, for instance. It is preferable to use a material that easily reflects light to form the second electrodes $E_0$ to $E_n$, because in this case light that has not been absorbed by the semiconductor film effective in photoelectric conversion can again enter the semiconductor film effective in photoelectric conversion, resulting in improvement of photoelectric conversion efficiency.

As a method for forming the second electrodes $E_0$ to $E_n$, there are a sputtering method, a vacuum evaporation method, a CVD method, a coating method, a printing method, and the like. The second electrodes $E_0$ to $E_n$ are formed to a thickness of 10 nm to 500 nm, preferably 50 nm to 100 nm.

In this embodiment, since light enters from the back side (the lower part in the drawing) of the substrate 300, the second electrodes $E_0$ to $E_n$ are formed using a material that has no light-transmitting property, but the structure of the second electrodes $E_0$ to $E_n$ is not limited thereto. For example, when light enters from the second electrodes $E_0$ to $E_n$ side (the upper part in the drawing), the second electrodes $E_0$ to $E_n$ can be formed using any of the light-transmitting conductive materials for the first electrode 302.

The second electrodes $E_0$ to $E_n$ are formed so as to be connected to the first electrodes $T_1$ to $T_n$ in the openings $C_1$, $C_3$, $C_5$, ..., $C_{n-1}$. In other words, the openings $C_1$, $C_3$, $C_5$, ..., $C_{n-1}$ are filled with the second electrodes $E_0$ to $E_n$. In this way, for example, the second electrode $E_1$ is electrically connected to the first electrode $T_2$, and the second electrode $E_{n-1}$ is electrically connected to first electrode $T_n$. Thus, each of the second electrodes can be electrically connected to the first electrode adjacent to the corresponding second electrode, and the unit cells $K_1$ to $K_n$ are electrically connected in series.

Further, an auxiliary electrode formed using a low-resistant conductive material may be formed so as to be in contact with the second electrodes $E_0$ to $E_n$.

A sealing resin layer 312 is formed using an epoxy resin, an acrylic resin, or a silicone resin. In the sealing resin layer 312, an opening portion 314 and an opening portion 316 are respectively formed over the second electrode $E_0$ and the second electrode $E_n$. The second electrodes $E_0$ and $E_n$ are connected respectively through the opening portions 314 and 316 to external wirings.

Thus, a unit cell $U_n$ including the first electrode $T_n$, the unit cell $K_n$, and the second electrode $E_n$ is formed over the substrate 300. Further, the first electrode $T_n$ is connected to the adjacent second electrode $E_{n-1}$ adjacent to the corresponding second electrode in the opening $C_{n-1}$. Accordingly, the photoelectric conversion device in which n unit cells are connected in series can be manufactured. The second electrode $E_0$ serves as an output electrode for the first electrode $T_1$ in the unit cell $U_1$.

By the above method, it is possible to manufacture a photoelectric conversion device in which a microcrystalline semiconductor film having high crystallinity is used as any of a semiconductor film effective in photoelectric conversion, a semiconductor film having a first conductivity type, or a semiconductor film having a second conductivity type. This can enhance the photoelectric conversion efficiency of a photoelectric conversion device. Note that, as long as the microcrystalline semiconductor film having high crystallinity may be used as any of the semiconductor film effective in photoelectric conversion, the semiconductor film having the first conductivity type, or the semiconductor film having the second conductivity type, the film to which the microcrystalline semiconductor film is applied can be changed as appropriate.

Further, when a microcrystalline semiconductor film in which the number and size of gaps between crystal grains are extremely small and the crystallinity is high is used as more than one of the above semiconductor films, a greater effect can be achieved.

Note that although a photoelectric conversion device having one unit cell is described in this embodiment, a photoelectric conversion device in which two or more unit cells are stacked as appropriate can be provided.

This embodiment can be implemented in appropriate combination with the other embodiments.

Embodiment 9

Figure 16:
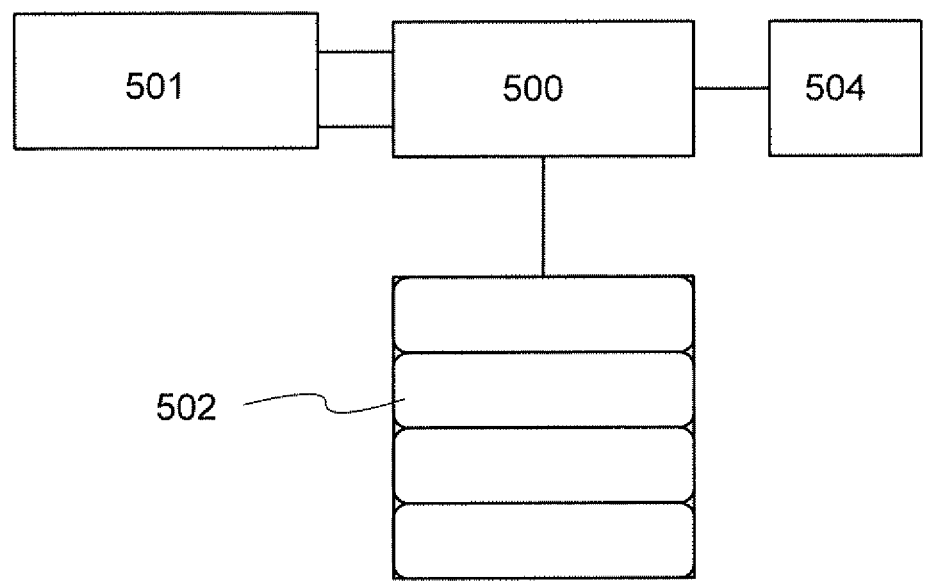
FIG. 16 illustrates a structure of a solar photovoltaic system.

FIG. 16 illustrates an example of a solar photovoltaic system in which a photoelectric conversion device 501 described in embodiment 8 is used. In a charge control circuit 500, a storage battery 502 is charged using electric power supplied from one or a plurality of photoelectric conversion devices 501. Further, in the case where the storage battery 502 is sufficiently charged, electric power supplied from the photoelectric conversion device 501 is directly output to a load 504.

When an electric double layer capacitor is used as the storage battery 502, chemical reaction is not necessary for charging; thus, the storage battery 502 can be charged rapidly. Further, lifetime can be increased about 8-fold and charging and discharging efficiency can be increased about 1.5-fold, compared with those of a lead storage battery or the like which uses chemical reaction. The solar photovoltaic system described in this embodiment can be used in a variety of loads 504 which use electric power, such as lighting or an electronic device.

This embodiment can be implemented in combination with any of the other embodiments, as appropriate.

This application is based on Japanese Patent Application serial no. 2009-194870 filed with Japan Patent Office on Aug. 25, 2009, the entire contents of which are hereby incorporated by reference.

What is claimed is:
1. A plasma CVD apparatus comprising,
a first electrode provided with a plurality of depressed openings, each depressed opening provided between projected portions of the first electrode and supplied with power; and
a second electrode opposite to the first electrode for placing a substrate and grounded,
wherein glow discharge plasma is generated between the first electrode and the second electrode by being supplied with the power,
wherein a gas supply port having a hollow opening is provided in each valley portion of the plurality of depressed openings, and
wherein the plurality of depressed openings each have a tapered shape and are chamfered or roundly chamfered.

2. The plasma CVD apparatus according to claim 1, wherein the power supplied for the first electrode is high-frequency power.

3. The plasma CVD apparatus according to claim 1, wherein the power supplied for the first electrode is high-frequency power of 60 MHz or less.

4. The plasma CVD apparatus according to claim 1, wherein the glow discharge plasma has high electron density.

5. The plasma CVD apparatus according to claim 1, wherein a distance between the first electrode and the second electrode is greater than or equal to 4 mm and less than or equal to 16 mm.

6. The plasma CVD apparatus according to claim 1, wherein a heater is provided in the second electrode.

7. A plasma CVD apparatus comprising,
a first electrode provided with a plurality of depressed openings, each depressed opening provided between projected portions of the first electrode and supplied with power; and
a second electrode opposite to the first electrode for placing a substrate and grounded,
wherein glow discharge plasma is generated between the first electrode and the second electrode by being supplied with the power,
wherein a gas supply port having a hollow opening is provided in each of the projected portions, and
wherein the plurality of depressed openings each have a tapered shape and are chamfered or roundly chamfered.

8. The plasma CVD apparatus according to claim 7, wherein the power supplied for the first electrode is high-frequency power.

9. The plasma CVD apparatus according to claim 7, wherein the power supplied for the first electrode is high-frequency power of 60 MHz or less.

10. The plasma CVD apparatus according to claim 7, wherein the glow discharge plasma has high electron density.

11. The plasma CVD apparatus according to claim 7, wherein a distance between the first electrode and the second electrode is greater than or equal to 4 mm and less than or equal to 16 mm.

12. The plasma CVD apparatus according to claim 7, wherein a heater is provided in the second electrode.

13. A method for manufacturing a microcrystalline semiconductor film comprising the steps of:
introducing a reactive gas into a reaction chamber through a gas supply port of a first electrode;
setting a pressure of the reaction chamber to greater than or equal to 450 Pa and less than or equal to 13332 Pa;
forming a plasma region between the first electrode and a second electrode by supplying power to the first electrode;
forming crystalline deposition precursors having crystallinity in a gas phase including the plasma region;
forming a crystal nucleus of greater than or equal to 5 nm and less than or equal to 15 nm by depositing the deposition precursors over a substrate; and
forming the microcrystalline semiconductor film by growing a crystal from the crystal nucleus,
wherein the first electrode has a common plane opposite to the second electrode and is provided with a plurality of depressed openings, and
wherein a distance between the first electrode and the second electrode is greater than or equal to 4 mm and less than or equal to 16 mm.

14. The method according to claim 13, wherein the power supplied for the first electrode is high-frequency power.

15. The method according to claim 13, wherein the power supplied for the first electrode is high-frequency power of 60 MHz or less.

16. The method according to claim 13, wherein the plasma region is high-density plasma region.

17. The method for manufacturing the microcrystalline semiconductor film according to claim 13, wherein a rare gas is included in the reactive gas.

18. The method for manufacturing the microcrystalline semiconductor film according to claim 13, wherein the gas supply port is provided on the plurality of depressed openings.

19. The method for manufacturing the microcrystalline semiconductor film according to claim 13, wherein the gas supply port is provided on the common plane.

20. A method for manufacturing a thin film transistor comprising the steps of:
forming a gate electrode over the substrate;
forming a gate insulating film which covers the gate electrode;
forming a microcrystalline semiconductor layer over the gate insulating film, using the method for manufacturing the microcrystalline semiconductor film according to claim 13; and
forming a wiring electrically connected to the microcrystalline semiconductor film.

* * * * *